United States Patent
Kitamura et al.

(10) Patent No.: US 10,305,389 B2
(45) Date of Patent: May 28, 2019

(54) CAPACITOR SUBSTRATE UNIT FOR OPENING/CLOSING MODULE

(71) Applicant: Mitsubishi Electric Corporation, Tokyo (JP)

(72) Inventors: Yasuhiko Kitamura, Tokyo (JP); Hiroaki Takahashi, Tokyo (JP); Shozo Kanzaki, Tokyo (JP); Toshiyuki Yasutomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/963,267

(22) Filed: Apr. 26, 2018

(65) Prior Publication Data

US 2018/0367055 A1     Dec. 20, 2018

(30) Foreign Application Priority Data

Jun. 14, 2017   (JP) ................................ 2017-116579

(51) Int. Cl.
*H05K 7/00*       (2006.01)
*H02M 7/00*       (2006.01)
(Continued)

(52) U.S. Cl.
CPC .......... *H02M 7/003* (2013.01); *H01G 9/0003* (2013.01); *H01G 9/028* (2013.01);
(Continued)

(58) Field of Classification Search
CPC ...... H02M 7/003; H02M 1/14; H01G 9/0003; H01G 9/028; H01G 9/045; H01G 9/15;
(Continued)

(56) References Cited

U.S. PATENT DOCUMENTS

| 5,604,674 A * | 2/1997 | Terasawa ............ H01L 25/0655 257/E25.012 |
| 2002/0167828 A1* | 11/2002 | Parkhill ................ H01L 25/072 363/144 |

(Continued)

FOREIGN PATENT DOCUMENTS

| JP | 2001-352767 A | 12/2001 |
| JP | 2006-197735 A | 7/2006 |

(Continued)

OTHER PUBLICATIONS

Communication dated Jul. 10, 2018 from the Japanese Patent Office in counterpart Application No. 2017-116579.

(Continued)

*Primary Examiner* — Hung S. Bui
(74) *Attorney, Agent, or Firm* — Sughrue Mion, PLLC; Richard C. Turner

(57) ABSTRACT

To downsize a power smoothing capacitor substrate unit for opening/closing modules configured to convert a low-voltage DC power to AC power to drive a three-phase AC motor. A plurality of unit capacitors (101) being a conductive polymer aluminum electrolytic capacitor are connected between a positive-side first conductive plate (10P0) connected to a positive-side power supply terminal (125P) and a negative-side second conductive plate (10N) connected to a negative-side power supply terminal (124N), and three or more capacitor rows are arranged for each of three pairs of divided power supply terminal blocks (130B) connected to the opening/closing modules (90B) and one or more capacitor rows are arranged between the terminal blocks. Accordingly, ripple currents in a large number of capacitors connected in parallel to each other are equalized to prevent a temperature increase in each capacitor.

16 Claims, 18 Drawing Sheets

(51) Int. Cl.

| | |
|---|---|
| *H05K 1/18* | (2006.01) |
| *H05K 1/11* | (2006.01) |
| *H01G 9/15* | (2006.01) |
| *H01G 11/04* | (2013.01) |
| *H01G 9/26* | (2006.01) |
| *H01G 11/10* | (2013.01) |
| *H01G 9/028* | (2006.01) |
| *H01G 9/045* | (2006.01) |
| *H01G 11/30* | (2013.01) |
| *H01G 11/78* | (2013.01) |
| *H05K 1/02* | (2006.01) |
| *H01G 11/18* | (2013.01) |
| *H01G 9/00* | (2006.01) |
| *H02M 1/14* | (2006.01) |
| *H02P 27/06* | (2006.01) |
| *H02M 7/5387* | (2007.01) |

(52) U.S. Cl.
 CPC ............... *H01G 9/045* (2013.01); *H01G 9/15* (2013.01); *H01G 9/26* (2013.01); *H01G 11/04* (2013.01); *H01G 11/10* (2013.01); *H01G 11/18* (2013.01); *H01G 11/30* (2013.01); *H01G 11/78* (2013.01); *H02M 1/14* (2013.01); *H02P 27/06* (2013.01); *H05K 1/0203* (2013.01); *H05K 1/111* (2013.01); *H05K 1/181* (2013.01); *H02M 7/5387* (2013.01); *H05K 2201/066* (2013.01); *H05K 2201/1009* (2013.01); *H05K 2201/10015* (2013.01); *H05K 2201/10166* (2013.01); *H05K 2201/10409* (2013.01); *H05K 2201/10522* (2013.01)

(58) Field of Classification Search
 CPC .......... H01G 9/26; H01G 11/04; H01G 11/10; H01G 11/18; H01G 11/30; H01G 11/78; H02P 27/06; H05K 1/0203; H05K 1/111
 USPC .......................................................... 361/821
 See application file for complete search history.

(56) References Cited

U.S. PATENT DOCUMENTS

| | | | |
|---|---|---|---|
| 2011/0031914 A1* | 2/2011 | Green | H02P 6/20 318/400.11 |
| 2011/0074326 A1* | 3/2011 | Su | H02P 5/74 318/400.27 |
| 2015/0340157 A1 | 11/2015 | Wen et al. | |
| 2015/0340961 A1 | 11/2015 | Wen et al. | |

FOREIGN PATENT DOCUMENTS

| | | |
|---|---|---|
| JP | 2009-239995 A | 10/2009 |
| JP | 2010-104204 A | 5/2010 |
| JP | 2010-193593 A | 9/2010 |
| JP | 3173512 U | 2/2012 |
| JP | 2013-251991 A | 12/2013 |
| JP | 2017-93080 A | 5/2017 |
| WO | 2013051476 A1 | 4/2013 |
| WO | 2015122069 A1 | 8/2015 |
| WO | 2016117144 A1 | 7/2016 |

OTHER PUBLICATIONS

Communication dated Dec. 4, 2018 by the Japanese Patent Office in counterpart application No. 2017-116579.

* cited by examiner

CAPACITOR SUBSTRATE UNIT FOR OPENING/CLOSING MODULE

BACKGROUND OF THE INVENTION

1. Field of the Invention

The present invention relates to a power conversion unit that is used, for example, in a drive circuit of a three-phase AC motor for vehicle traveling, and more particularly, to improvement in a power smoothing capacitor substrate for a semiconductor opening/closing element module that constructs the power conversion unit.

2. Description of the Related Art

The following power conversion unit has been broadly put to practical use. Specifically, the power conversion unit converts a DC voltage of an on-vehicle battery, which is configured to generate an output voltage of from 300 V to 400 V to an AC voltage, to rotationally drive a three-phase AC motor for vehicle traveling. Further, the power conversion unit rectifies, to a DC voltage, a three-phase AC generation voltage generated by inertial rotation of the motor at the time of down-hill driving or deceleration driving, to regenerate the on-vehicle battery.

Examples of the motor (motor generator) used herein include: a motor having a set of windings of three phases that are U, V, and W phases; a motor in which winding operation of a thick wire, through which a large current flows, is facilitated with use of two intermediately thick wires that are wound and connected in parallel at an outlet of the motor to consequently form a set of three-phase windings; and a motor in which intermediately thick wires are separated into two sets of windings of three phases that are U1, V1, and W1 phases and U2, V2, and W2 phases.

Examples of an opening/closing module connected to the motor include: a module in which a set of three-phase AC voltages are generated to be supplied to a set of three-phase windings; a module of a double same three-phase system configured to operate with one set of three-phase AC voltages that corresponds to two sets of three-phase AC voltages that are in-phase voltages generated to be supplied to two sets of three-phase windings; and a module of a double inclined three-phase system in which a phase difference, for example, 30 degrees, is set in two sets of three-phase AC voltages, to thereby prevent rotational ripple fluctuation (cogging) of the motor. The double same three-phase system is aimed at dispersing generated heat of an opening/closing element configured to interrupt a motor current (load current).

Meanwhile, the power smoothing capacitor is used in a DC power supply portion in order to prevent pulsation and fluctuation of a power supply voltage associated with intermittent control of a load current, by the opening/closing module formed by integrating a plurality of opening/closing elements. Electrostatic energy stored in the above-mentioned capacitor is defined by the product of a square of a charged voltage and a capacitance, and hence a capacitor with a smaller capacitance can be used for storing the same electrostatic energy when a higher system voltage is set. In contrast, when a lower system voltage is set, a volume of the capacitor is reduced while a larger capacitance is needed, but attention needs to be paid on parallel connection of the capacitors, and equalization of branched ripple currents is required.

For example, according to FIG. 1 and FIG. 12 for a "power unit for a power converter" disclosed in Japanese Patent Application Laid-open No. 2001-352767 (FIG. 1 and ABSTRACT OF THE DISCLOSURE), a smoothing capacitor 9 includes twenty-four unit capacitors 9u, which are presumed to be film capacitors, and is connected to a power module 1 including six bipolar transistors so as to supply electricity to a three-phase motor 12. In the cases of FIG. 3 and FIG. 14, smoothing capacitors 9a and 9b each include twenty four×two unit capacitors 9u, which are presumed to be film capacitors and are intensively arrayed on the front and back sides of the high current wiring board 1. Further, the smoothing capacitors 9a and 9b are connected to a pair of power modules 1a and 1b each including six bipolar transistors, to supply electricity to a double three-phase motor 12a.

Meanwhile, according to FIG. 1, FIG. 2, and FIG. 17, and paragraphs 0025, 0026, and 0031 for a "power converter" disclosed in Japanese Patent Application Laid-open No. 2010-104204 (FIG. 1 and ABSTRACT OF THE DISCLOSURE), for example, a voltage of 300 V from a DC power supply 12 is boosted to 600 V by a booster 11, and is applied to a capacitor 2, which is presumed to be a film capacitor, so that double three-phase AC motors 13 and 13 are supplied with electricity via six semiconductor modules 3 including two bipolar transistors 32a and 32b, which are positive and negative bipolar transistors.

DC terminals 30 of the respective semiconductor modules 3 are separately connected by screwing to electrode terminals 20 of the capacitor 2 (see FIG. 17) so as to reduce dispersion of a current and a parasitic inductance.

However, the related arts have the following problems.

(1) Description of Problems of Related Arts

In the "power unit for a power converter" according to Japanese Patent Application Laid-open No. 2001-352767 (FIG. 1 and ABSTRACT OF THE DISCLOSURE) described above, due to a large area of the wiring substrate on which a large number of unit capacitors are connected in parallel to each other and a long distance from the power module, a noise voltage is generated by a parasitic inductance and the ripple currents flowing in the large number of unit capacitors cannot be equalized, which have been problematic.

In the "power converter" according to Japanese Patent Application Laid-open No. 2010-104204 (FIG. 1 and ABSTRACT OF THE DISCLOSURE), the capacity of the capacitor and the number of capacitors used are reduced by increasing a voltage to shorten the distance between the module and the capacitor. However, short-circuit preventive measures need to be taken by increasing an insulating distance of each portion so as to increase voltage resistance, and the danger against an electric shock increases, which have been problematic.

SUMMARY OF THE INVENTION (2) Description of Object of Invention

It is an object of the present invention to provide a power conversion unit configured to supply AC power to a three-phase AC motor from a DC power supply of a low voltage system with a DC lower than 60 V, for example, in order to reduce damage by an electric shock, and more particularly, to a capacitor substrate unit capable of dealing with an increase in drive current and an increase in capacitance of a power smoothing capacitor associated with lowering of a voltage, to thereby prevent a size increase.

According to one embodiment of the present invention, there is provided a capacitor substrate unit for opening/closing modules, which is connected between a DC power supply and three or six opening/closing modules each having an opening/closing element built-in, and includes a plurality of unit capacitors connected in parallel to each other on a composite circuit board to perform power supply smoothing, the opening/closing element being configured to convert a DC power obtained from the DC power supply to AC power so as to drive one of a three-phase AC motor and a double three-phase AC motor, in which the composite circuit board includes:
a DC power supply terminal block including a positive-side power supply terminal and a negative-side power supply terminal that are connected to a positive terminal and a negative terminal of the DC power supply;
three or six divided power supply terminal blocks each including a positive-side divided terminal and a negative-side divided terminal respectively connected to a positive-side electrode terminal and a negative-side electrode terminal of each of the three or six opening/closing modules;
one of a positive-side first conductive plate and a negative-side first conductive plate connected to corresponding one of the positive-side power supply terminal and the negative-side power supply terminal;
one of a negative-side second conductive plate and a positive-side second conductive plate connected to corresponding one of the negative-side power supply terminal and the positive-side power supply terminal having a polarity opposite to a polarity of the negative-side power supply terminal; and
a front-side prepreg member configured to bond the one of the positive-side first conductive plate and the negative-side first conductive plate and corresponding one of the negative-side second conductive plate and the positive-side second conductive plate while providing insulation.

Further, the one of the positive-side first conductive plate and the negative-side first conductive plate and the front-side prepreg member have formed therein a conductive plate through hole and a surface layer through hole, through which a connector of any one of a negative-side lead terminal and a positive-side lead terminal of each of the plurality of unit capacitors passes.

The one of the positive-side lead terminal and the negative-side lead terminal of each of the plurality of unit capacitors being a surface mount device is soldered to corresponding one of the positive-side first conductive plate and the negative-side first conductive plate, and the one of the negative-side lead terminal and the positive-side lead terminal of each of the plurality of unit capacitors is soldered to corresponding one of the negative-side second conductive plate and the positive-side second conductive plate.

The one of the negative-side second conductive plate and the positive-side second conductive plate is connected to corresponding one of the negative-side power supply terminal and the positive-side power supply terminal and corresponding one of the negative-side divided terminal and the positive-side divided terminal, while the one of the positive-side first conductive plate and the negative-side first conductive plate is connected to corresponding one of the positive-side power supply terminal and the negative-side power supply terminal and corresponding one of the positive-side divided terminal and the negative-side divided terminal.

Each of the plurality of unit capacitors is formed of one of a conductive polymer solid aluminum electrolytic capacitor and a conductive polymer hybrid aluminum electrolytic capacitor, and is included in a plurality of capacitor rows, each of which includes a plurality of unit capacitors arrayed along a shorter side of the composite circuit board and which are arrayed along a longer side of the composite circuit board.

The three or six divided power supply terminal blocks include three divided power supply terminal blocks or the pair of three divided power supply terminal blocks, namely, six divided power supply terminal blocks arrayed along one or two longer sides of the composite circuit board having a rectangular structure.

A total number of the plurality of capacitor rows is two or more for one or a pair of the three or six divided power supply terminal blocks, and at least one common capacitor row is arranged between the three or six divided power supply terminal blocks.

As described above, the capacitor substrate unit according to the present invention is an aggregate of unit capacitors connected between the DC power supply and the three or six opening/closing modules each having the opening/closing element built-in for driving the three-phase AC motor. The unit capacitor is formed of the conductive polymer aluminum electrolytic capacitor being a surface mount device. The first conductive plate to which one of the lead terminals of the plurality of unit capacitors and the second conductive plate to which another lead terminal is soldered are insulated and bonded to each other by using the prepreg member. One of the positive-side and negative-side power supply terminals and one of the positive-side and negative-side divided terminals, to which the three or six opening/closing modules are connected, are connected to the first conductive plate and the second conductive plate. Two or three unit capacitor rows are arranged for one or a pair of three or a pair of three divided power supply terminal blocks, while at least one capacitor row is arranged in common between the three or the pair of three divided power supply terminal blocks.

As a result, a large number of small-capacity unit capacitors can be arrayed densely on the composite circuit board to reduce the size, and reduce a ripple current for each unit capacitor, thereby producing the effect of preventing a temperature increase due to an internal loss of the capacitor that is defined by the product of a ripple current proportional to a value of a capacitance C, a square value thereof, and an equivalent series resistance ESR, to prevent the life of the capacitor from being shortened.

Pseudo sine-wave currents flow into the opening/closing modules connected respectively to the three phase windings of U, V, and W at a phase difference of 120 degrees, and the maximum current does not flow in the plurality of opening/closing modules at the same time.

Accordingly, for example, the capacitor rows arranged at the intermediate position between the U and V phases or the V and W phases contribute to the U phase when the U-phase current is large, and the capacitor rows contribute to the V phase when the V-phase current is large, to exert a function substantially equivalent to a function obtained by increasing the number of capacitor rows, adjacently arranged on both phases, by one to enable reduction in number of capacitor rows as a whole. It is preferred that capacitor rows in number not smaller than a half the number of capacitors in one row be arranged at each of the left position to the U phase (the opposite position to the V-phase side) and the right position to the W phase (the opposite position to the V-phase side).

With no plated through hole used in soldering of unit capacitors, it is possible to easily perform solder mounting by using surface mount-type unit capacitors.

With a configuration in which the soldering connection between the unit capacitors and the soldering connection between one of the positive-side and negative-side power supply terminals and one of the first conductive plate and the second conductive plate can be performed within the same processing step, it is possible to reduce a soldering operation process.

DESCRIPTION OF THE EMBODIMENTS

Detailed Description of First Embodiment (1) Detailed Description of Configuration In the following, a detailed description is given of a configuration illustrated in FIG. 1, which is a configuration view of an entire capacitor substrate unit according to a first embodiment of the present invention, with reference to the partial detailed views of FIG. 2 to FIG. 6B.

Figure 1:
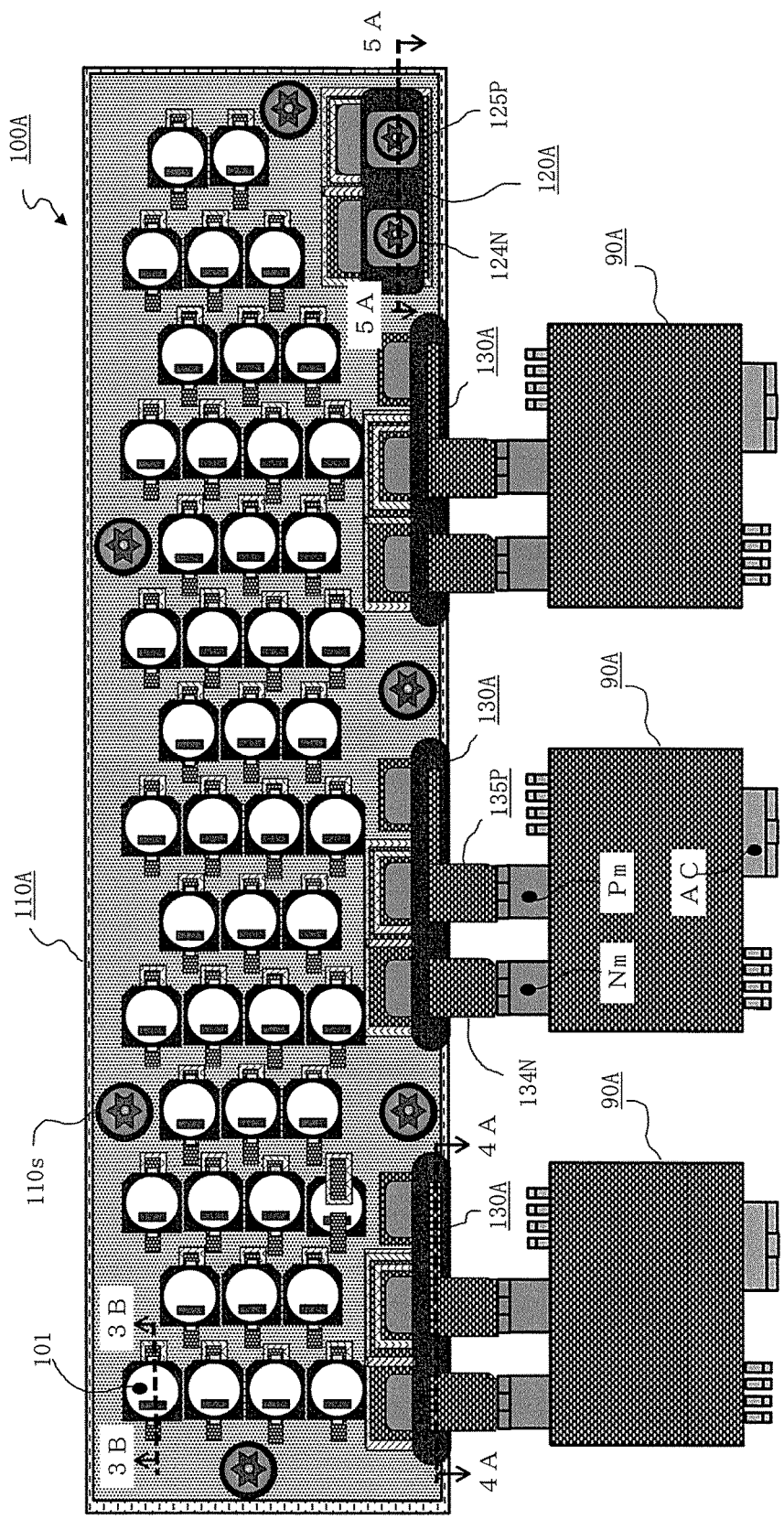
FIG. 1 is a configuration view of an entire capacitor substrate unit according to a first embodiment of the present invention.

In FIG. 1, a composite circuit board 110A, which is a main component of a capacitor substrate unit 100A, includes a plurality of laminate members described later with reference to FIG. 3A, and has a surface layer on which a plurality of unit capacitors 101 are connected in parallel to each other.

A DC power supply terminal block 120A and three divided power supply terminal blocks 130A are mounted onto one of longer sides (hereinafter sometimes referred to as a lower side) of the composite circuit board 110A having a rectangular shape. The composite circuit board 110A is mounted onto a base plate 150 (see FIG. 15A) and is fixed thereto via mounting screws 110s.

A positive-side power supply terminal 125P and a negative-side power supply terminal 124N are integrally molded on the DC power supply terminal block 120A made of a resin mold member, and the respective power supply terminals are connected to a positive electrode terminal and a negative electrode terminal of the DC power supply being, for example, a DC 48V on-vehicle battery (not shown).

Similarly, a positive-side divided terminal 135P and a negative-side divided terminal 134N are integrally molded on each of the three divided power supply terminal blocks 130A made of a resin mold member, and the respective divided terminals are joined by welding to a positive-side electrode terminal Pm and a negative-side electrode terminal Nm of each of the three opening/closing modules 90A described later with reference to FIG. 6A and FIG. 6B.

Further, the three opening/closing modules 90A are connected to three-phase windings of three-phase AC motors (not shown) via AC electrode terminals AC provided in the opening/closing modules 90A, and in the first embodiment, the three-phase AC motor includes a set of three-phase windings of U, V, and W phases.

The positive-side power supply terminal 125P, the three positive-side divided terminals 135P, and positive-side lead terminals 101p of the plurality of unit capacitors 101 are electrically connected in an integrated manner, and the negative-side power supply terminal 124N, the three negative-side divided terminals 134N, and negative-side lead terminals 101n of the plurality of unit capacitors 101 are electrically connected in an integrated manner.

Each of the plurality of unit capacitors 101 if formed of a conductive polymer solid aluminum electrolytic capacitor or a conductive polymer hybrid aluminum electrolytic capacitor. When the conductive polymer hybrid aluminum electrolytic capacitor is used, the unit capacitor 101 has impregnated therein an electrolyte that promotes recovery of an oxide film to be a dielectric of the capacitor. Thus, the unit capacitor 101 avoids damage due to a short circuit with self-recovery, and accordingly increases pressure resistance, to thereby enable improvement in reliability.

However, whichever capacitor is used, a value of equivalent series resistance ESR generated inside the capacitor has a negative temperature characteristic, in which the value decreases along with an increase in environmental temperature. In the case of capacitors being connected in series, an increase in ripple current in some of the capacitors leads to a vicious circle in which sharing of the ripple current of the capacitors further increases along with an increase in temperature of the capacitors.

It is therefore necessary that a large number of capacitors be connected in parallel to each other to limit a ripple current for each capacitor, and a capacitor having small fluctuation in variations of the equivalent series resistance ESR be used.

Figure 2:
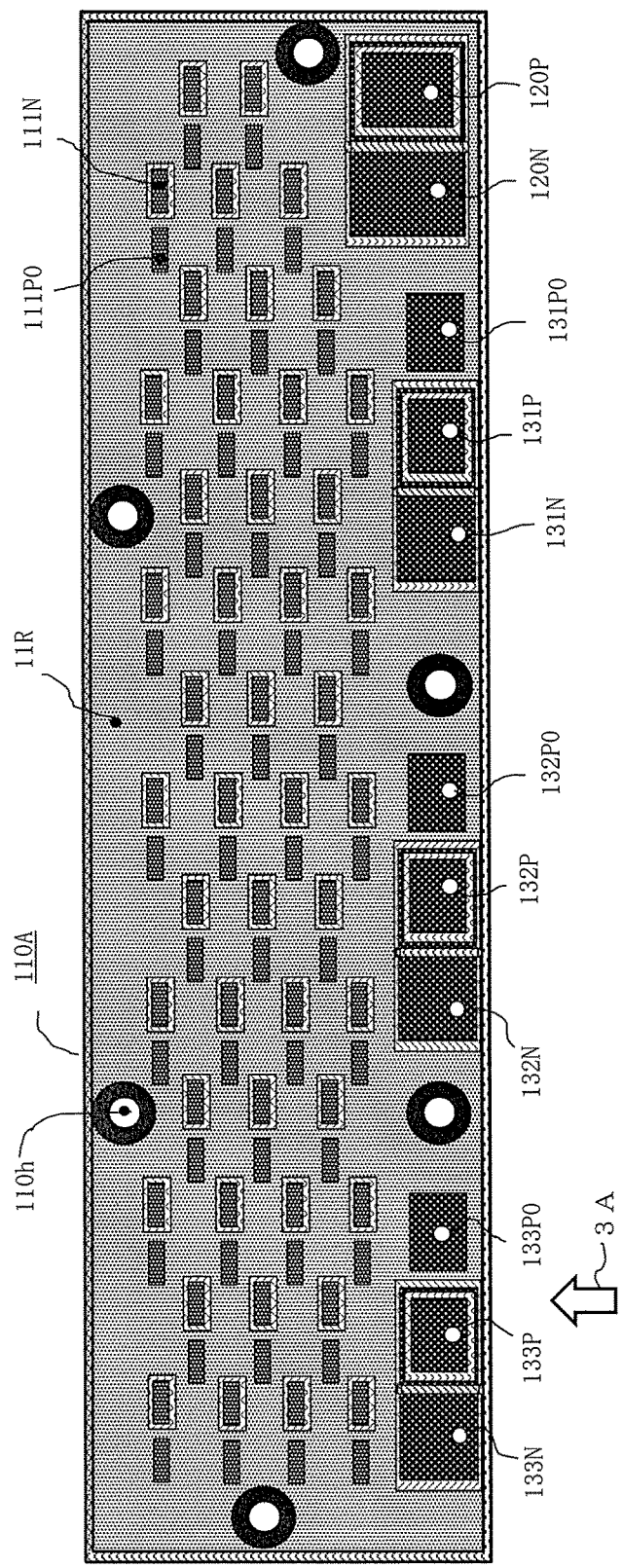
FIG. 2 is a plan view of a composite circuit board illustrated in FIG. 1.

Next, a description is given of FIG. 2 being a plan view of the composite circuit board 110A illustrated in FIG. 1.

In FIG. 2, most of the upper surface of the composite circuit board 110A is coated by a solder resist film 11R described later with reference to FIG. 3B, but in the following, a portion exposed from the solder resist film 11R is described.

A mounting hole 110h is a clearance hole through which the mounting screw 110s in FIG. 1 passes. The mounting screw 110s passes through this clearance hole via an insulating bush (not shown), which is a tubular member having a flange portion with a large diameter, so as to fix and mount the composite circuit board 110A to the base plate 150 (see FIG. 15A).

Figure 3A:
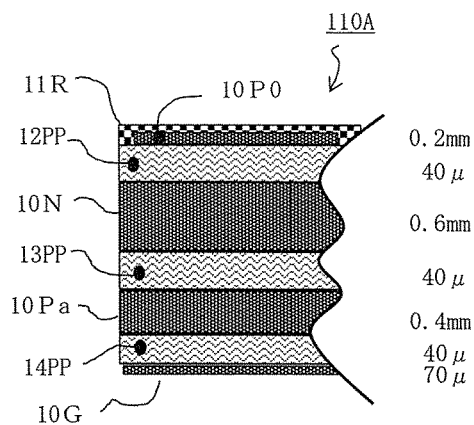
FIG. 3A is a side view of the composite circuit board viewed in a direction indicated by the arrow 3A of FIG. 2.

The positive-side lead terminal 101p and the negative-side lead terminal 101n of the unit capacitor 101 described later with reference to FIG. 3A are connected by soldering to a positive-side lead connecting section 110P0 and a negative-side lead connecting section 111N, respectively, and the surfaces of the connection are a positive-side first conductive plate 10P0 and a negative-side second conductive plate 10N, which are described later.

Figure 5A:
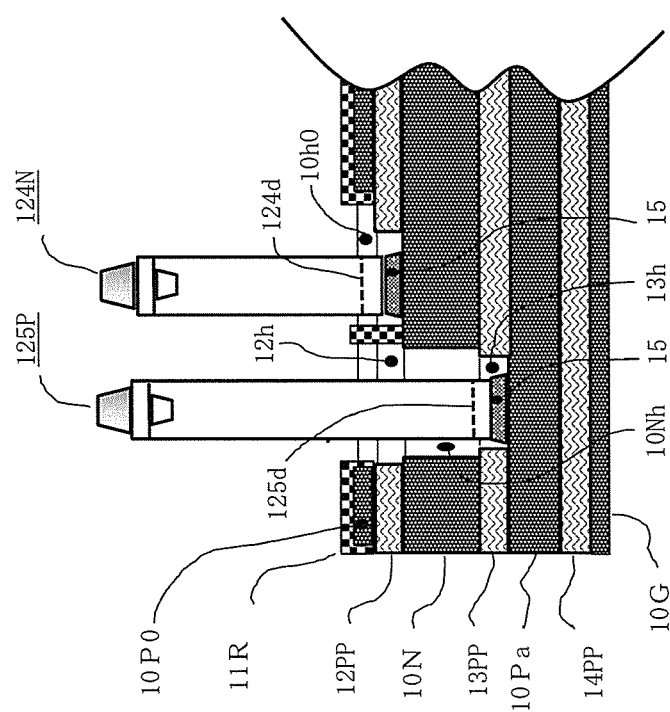
FIG. 5A is a cross-sectional view of the composite circuit board taken along the line 5A-5A of FIG. 1.

The positive-side power supply terminal 125P and the negative-side power supply terminal 124N described later with reference to FIG. 5A are connected by soldering to a positive-side power supply terminal connecting section 120P and a negative-side power supply terminal connecting section 120N, respectively, and the surfaces of the connection are a positive-side auxiliary conductive plate 10Pa and the negative-side second conductive plate 10N that are described later.

Figure 4A:
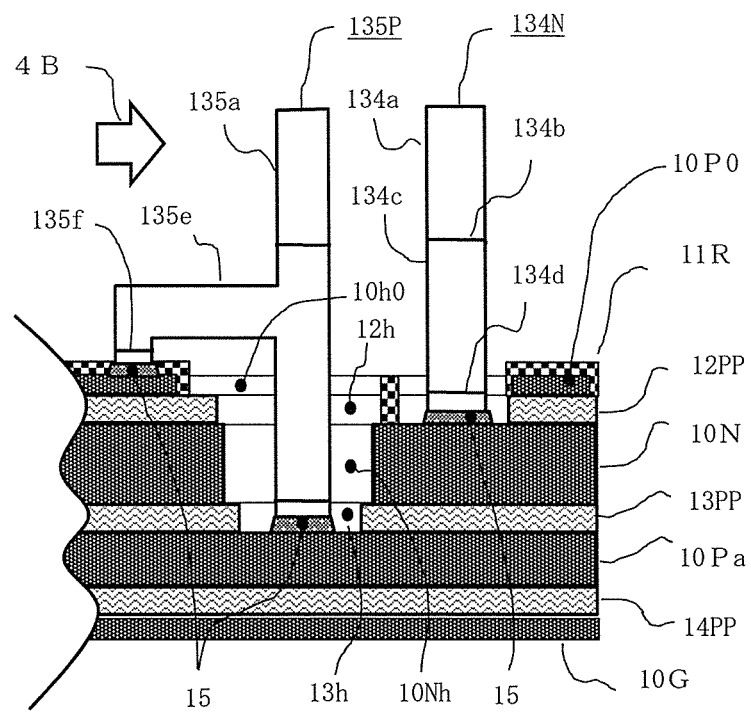
FIG. 4A is a cross-sectional view of the composite circuit board taken along the line 4A-4A of FIG. 1.

The positive-side divided terminal 135P and the negative-side divided terminal 134N, which are described later with reference to FIG. 4A, are connected by soldering to positive-side auxiliary conductive plate connecting sections 131P, 132P, and 133P and negative-side second conductive plate connecting sections 131N, 132N, and 133N, respectively.

The positive-side divided terminal 135P is connected by soldering to positive-side first conductive plate connecting sections 131P0, 132P0, and 133P0 via a branched coupling portion 135e of FIG. 4A.

Next, a description is given of FIG. 3A being a side view of the composite circuit board viewed in a direction indicated by the arrow 3A of FIG. 2.

In FIG. 3A, the composite circuit board 110A is made of the following laminate member.

The positive-side first conductive plate 10P0 is copper foil having a thickness of from 0.1 mm to 0.2 mm, for example. The solder resist film 11R is applied to the surface of the positive-side first conductive plate 10P0 except for a solder connecting section after the lamination process.

A front-side prepreg member 12PP is reinforced plastic foil having a thickness of 40 μm, for example, and is an insulating member in which an adhesive is impregnated and members located on both surfaces thereof are fixedly bonded by heating and pressing.

The negative-side second conductive plate 10N is a copper plate having a thickness of 0.6 mm, for example. In a similar manner, an intermediate prepreg member 13PP having a thickness of 40 μm, a positive-side auxiliary conductive plate 10Pa being a copper plate having a thickness of 0.4 mm, a back-side prepreg member 14PP having a thickness of 40 μm, and a ground conductive plate 10G being copper foil having a thickness of 70 μm are laminated in this order.

However, the thickness dimension described herein represents one example. The thickness dimension illustrated in FIG. 3A is enlarged and emphasized, and is thus not a proportional dimension. The ground conductive plate 10G is expressed taking a vehicle as the ground.

Figure 3B:
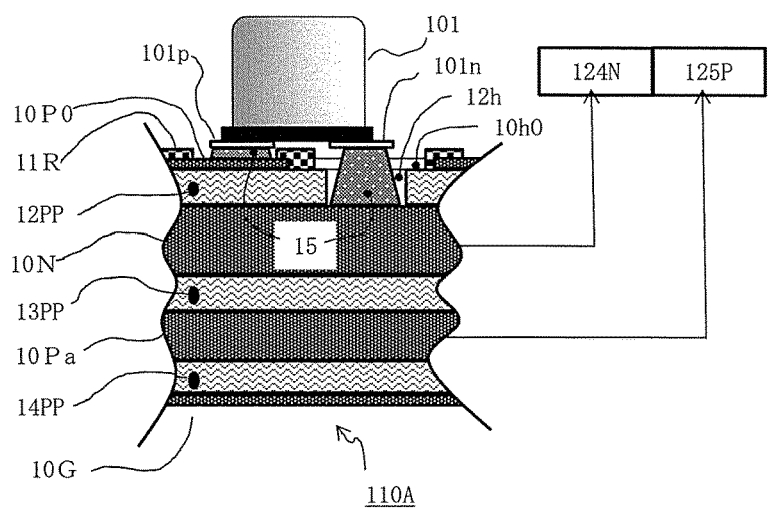
FIG. 3B is a cross-sectional view of the composite circuit board taken along the line 3B-3B of FIG. 1.

Next, a description is given of FIG. 3B being a cross-sectional view of the composite circuit board taken along the line 3B-3B of FIG. 1.

In FIG. 3B, the positive-side lead terminal 101p of the unit capacitor 101 is connected to the positive-side first conductive plate 10P0 by heating and melting the solder 15 that has been applied to the surface of the positive-side first conductive plate 10P0. The periphery of the solder 15 is protected by the solder resist film 11R so that flowing and diffusion of the solder is prevented.

The negative-side lead terminal 101n of the unit capacitor 101 passes through a conductive plate through hole 10h0 formed in the positive-side first conductive plate 10P0 and a surface layer through hole 12h formed in the front-side prepreg member 12pp, and is connected to the negative-side second conductive plate 10N by the solder 15 that has been applied to the surface of the negative-side second conductive plate 10N. The periphery of the solder 15 is protected by the solder resist film 11R so that the solder is not brought into contact with the positive-side first conductive plate 10P0.

In FIG. 3B, the thickness dimension of each portion is enlarged, and the solder 15 on the negative-side lead terminal 10n side has an abnormally large height. However, consideration is made such that a value obtained by adding the plate thickness dimension of the positive-side first conductive plate 10P0 and the plate thickness dimension of the front-side prepreg member 12PP, which is a gap between the solder surfaces, is as small as possible.

Figure 3C:
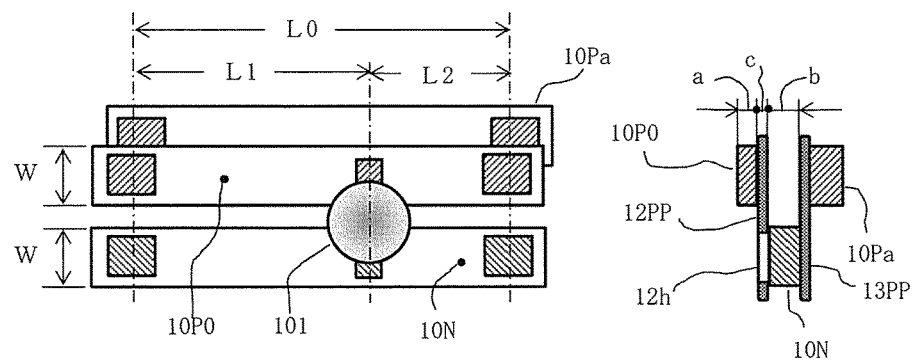
FIG. 3C is an explanatory view of calculation of wiring resistance against a unit capacitor illustrated in FIG. 1.

Next, a description is given of FIG. 3C being an explanatory view of calculation of wiring resistance against the unit capacitor 101 illustrated in FIG. 1.

In FIG. 3C, the front-side prepreg member 12pp having a plate thickness dimension c is bonded between the positive-side first conductive plate 10P0 having a plate thickness dimension a and the negative-side second conductive plate 10N having a plate thickness dimension b, and to the back surface thereof, the positive-side auxiliary conductive plate 10Pa is bonded via the intermediate prepreg member 13PP.

The unit capacitor 101 that connects the positive-side first conductive plate 10P0 to the negative-side second conductive plate 10N is arranged at a position of a first representative distance L1 from the contact surface of the positive divided terminal 135P or the negative divided terminal 135N.

An equivalent wiring width W is estimated by measuring a resistance value between the positive-side divided terminal 135P and the negative-side divided terminal 135N under a state in which the unit capacitor 101 is short-circuited, and performing inversion operation with a reciprocated wiring resistance R that is the obtained resistance value. The relationship is represented by Expression (1) where specific resistance of the conductive plate is p.

$$R=[L1/(a \times W)+L1/(b \times W)] \times \rho = K1 \times (1+1/\gamma)/b \quad (1)$$

In the above, $K1=L1 \times \rho/W$, and $\gamma=a/b$.

As a first calculation example, when the reciprocated wiring resistance at the time of a=b=0.3 mm is R1, Expression (1a) holds by setting $\gamma=1.0$ and b=0.3 in Expression (1).

$$R1=6.67 \times (L1 \times \rho/W) \quad (1a)$$

As a second calculation example, when the reciprocated wiring resistance at the time of a=0.2 mm and b=0.6 mm is R2, Expression (1b) holds by setting $\gamma=\frac{1}{3}$ and b=0.6 in Expression (1).

$$R2=6.67 \times (L1 \times \rho/W) \quad (1b)$$

Therefore, in the second calculation example, a total thickness dimension of the conductive plate increases from 0.6 mm to 0.8 mm by 33%, but the reciprocated wiring resistance R2 is the same as the reciprocated wiring resistance R1.

In the first embodiment of FIG. 1, the divided power supply terminal blocks 130A are arranged only on the lower-side longer side of the composite circuit board 110A, and the three opening/closing modules 90A are connected to the divided power supply terminal blocks 130A.

However, assuming that the three divided power supply terminal blocks 130A are also provided on the upper-side longer side of the composite circuit board 110A and that the opening/closing module 90A is not connected to that divided power supply terminal blocks 130A, the value of the reciprocated wiring resistance R in FIG. 3C is reduced significantly.

That is, a portion corresponding to a second representative distance L2 constructs a parallel circuit to a portion corresponding to the first representative distance L1. The second representative distance L2 is obtained by subtracting the first representative distance L1 from a board width dimension L0 which is an interval between the divided power supply terminal blocks 130A arranged on the upper and lower sides. Consequently, it is possible to reduce the wiring resistance due to the thin first conductive plate.

Figure 4B:
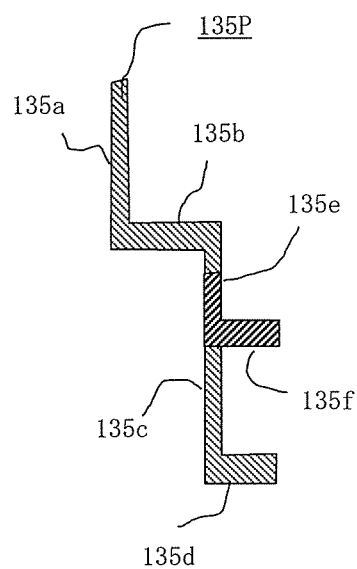
FIG. 4B is a side view of a positive-side divided terminal viewed in a direction indicated by the arrow 4B of FIG. 4A.

Next, a description is given of FIG. 4A being a cross-sectional view of the composite circuit board taken along the line 4A-4A of FIG. 1, and FIG. 4B being a side view of the positive-side divided terminal viewed in a direction indicated by the arrow 4B of FIG. 4A.

In FIG. 4A and FIG. 4B, the positive-side divided terminal 135P includes a shelf plate portion 135b that is orthogonally bent from a module connecter 135a, an orthogonal portion 135c that is orthogonally bent again to be parallel to the module connecter 135a, and a positive-side connector 135d that is orthogonally bent from the orthogonal portion 135c. This positive-side connector 135d and the positive-side auxiliary conductive plate 10Pa are arranged in parallel and connected by soldering to each other by using the solder 15.

The branched coupling portion 135e is provided at the intermediate position of the orthogonal portion 135c, and a through connector 135f that is parallel to the positive-side first conductive plate 10P0 is provided at the distal position of the branched coupling portion 135e, so as to be connected by soldering to the positive-side first conductive plate 10P0 by using the solder 15.

The orthogonal portion 135c passes through the conductive plate through hole 10h0 formed in the positive-side first conductive plate 10P0, the surface layer through hole 12h formed in the front-side prepreg member 12PP, a negative-side plate through hole 12Nh formed in the negative-side second conductive plate 10N, and an intermediate layer through hole 13h formed in the intermediate prepreg member 13PP. The positive-side connector 135d and the through hole connector 135f connect the positive-side auxiliary conductive plate 10Pa to the positive-side first conductive plate 10P0.

The positive-side auxiliary conductive plate 10Pa is connected to the positive-side power supply terminal 125P, as illustrated in FIG. 5A described later.

Meanwhile, the negative-side divided terminal 134N includes a shelf plate portion 134b that is orthogonally bent from a module connecter 134a, an orthogonal portion 134c that is orthogonally bent again to be parallel to the module connecter 134a, and a negative-side connector 134d that is orthogonally bent from the orthogonal portion 134c. This negative-side connector 134d and the negative-side second conductive plate 10N are arranged in parallel and connected by soldering to each other by using the solder 15.

The orthogonal portion 134c passes through the conductive plate through hole 10h0 formed in the positive-side first conductive plate 10P0 and the surface layer through hole 12h formed in the front-side prepreg member 12PP.

The negative-side second conductive plate 10N is connected to the negative-side power supply terminal 124N as illustrated in FIG. 5A described later.

Next, a description is given of FIG. 5A being a cross-sectional view of the composite circuit board taken along the line 5A-5A of FIG. 1.

In FIG. 5A, the positive-side power supply terminal 125P passes through the conductive plate through hole 10h0 formed in the positive-side first conductive plate 10P0, the surface layer through hole 12h formed in the front-side prepreg member 12PP, a negative-side plate through hole 10Nh formed in the negative-side second conductive plate 10N, and the intermediate layer through hole 13h formed in the intermediate prepreg member 13PP. A positive-side connector 125d arranged in parallel to the positive-side auxiliary conductive plate 10Pa is provided, and the positive-side auxiliary conductive plate 10Pa and the positive-side connector 125d are connected by soldering by using the solder 15.

The negative-side power supply terminal 124N passes through the conductive plate through hole 10h0 formed in the positive-side first conductive plate 10P0 and the surface layer through hole 12h formed in the front-side prepreg member 12PP. The negative-side connector 124d arranged in parallel to the negative-side second conductive plate 10N is provided. The negative-side second conductive plate 10N and the negative-side connector 124d are connected by soldering by using the solder 15.

Accordingly, the positive-side power supply terminal 125P, the three positive-side divided terminals 135P, and the positive-side lead terminals 101p of the plurality of unit capacitors 101 are electrically connected in an integrated manner, and the negative-side power supply terminal 124N, the three negative-side divided terminals 134N, and the negative-side lead terminals 101n of the plurality of unit capacitors 101 are electrically connected in an integrated manner.

Adding a description with reference to FIG. 4A and FIG. 5A to the description of the divided power supply terminal block 130A and the DC power supply terminal block 120A, which are described with reference to FIG. 1, a resin member formed by integrally molding the positive-side and negative-side divided terminals 135P and 134N and the positive-side and negative-side power supply terminals 125P and 124N is fixed by bonding to the surface of the composite circuit board 110A by using an adhesive, or preferably fixed by bonding directly to the surface of the negative-side second conductive plate 10N in which the positive-side first conductive plate 10P0 and the front-side prepreg member 12PP have been removed, so as to reduce external force that acts on the solder joint surface.

Figure 6A:
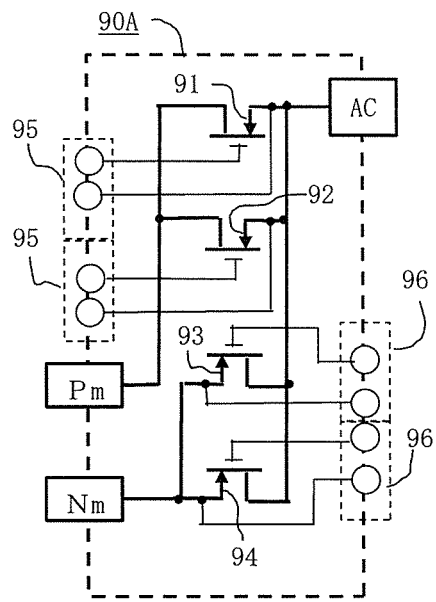
FIG. 6A is an internal configuration diagram of an opening/closing module illustrated in FIG. 1.
Figure 6B:
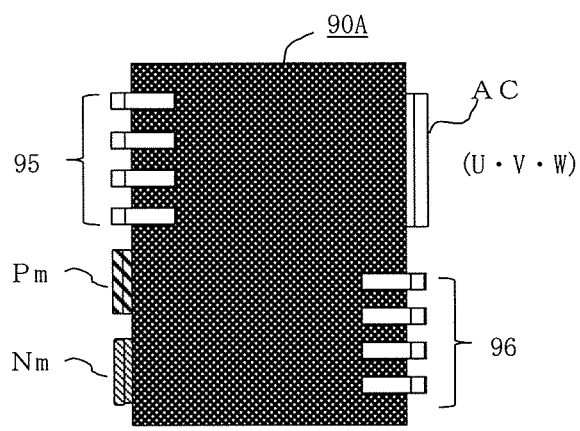
FIG. 6B is an external view for illustrating a terminal arrangement of the opening/closing module illustrated in FIG. 1.

Next, a description is given of FIG. 6A being an internal configuration diagram of the opening/closing module 90A illustrated in FIG. 1, and FIG. 6B being an external view for illustrating a terminal arrangement of the opening/closing module 90A.

In FIG. 6A, the opening/closing module 90A mainly includes a parallel circuit of first and second upstream opening/closing elements 91 and 92, which are connected between the positive-side electrode terminal Pm and the AC electrode terminal AC, and a parallel circuit of first and second downstream opening/closing elements 93 and 94, which are connected between the negative-side electrode terminal Nm and the AC electrode terminal AC. An N-channel type field effect transistor is used for each opening/closing element.

A first or second gate signal for driving to close the first and second upstream opening/closing elements 91 and 92 is provided from a control circuit portion 140 (see FIG. 15A) to the pair of upstream gate drive terminals 95 and 95. In addition, a first or second gate signal for driving to close the first and second downstream opening/closing elements 93 and 94 is provided from the control circuit portion 140 (see FIG. 15A) to the pair of downstream gate drive terminals 96 and 96.

In FIG. 6B, the opening/closing module 90A is subjected to resin sealing and integrated. The positive-side electrode terminal Pm, the negative-side electrode terminal Nm, and the upstream gate drive terminal 95 are provided on one side of right and left sides on the opposite positions. The AC electrode terminal AC and the downstream gate drive terminal 96 are provided on another side.

The positive-side electrode terminal Pm and the negative-side electrode terminal Nm are connected by welding to the positive-side divided terminals 135P and the negative-side divided terminals 134N in three sets as illustrated in FIG. 1. The AC electrode terminal AC is connected to each of the three-phase windings U, V, and W of the three-phase AC motor (not shown) via an external wiring terminal (not shown).

When the three-phase AC motor has a set of three-phase windings and uses three opening/closing modules with respect thereto, the upstream opening/closing elements 91 and 92, and the downstream opening/closing elements 93 and 94 are connected in parallel to each other and used. However, when the three-phase AC motor has two sets of three-phase windings with the same output capacity, one upstream opening/closing element and one downstream opening/closing element can be used.

(2) Main Points and Features of First Embodiment

As apparent from the above description, the capacitor substrate unit according to the first embodiment of the present invention is the capacitor substrate unit 100A for opening/closing modules, which is connected between the DC power supply and the three opening/closing modules 90A each having the opening/closing element built-in, and includes the plurality of unit capacitors 101 connected in parallel to each other on the composite circuit board 110A to perform power supply smoothing. The opening/closing element is configured to convert DC power obtained from the DC power supply to AC power so as to drive a three-phase AC motor.

The composite circuit board 110A has the DC power supply terminal block 120A including the positive-side power supply terminal 125P and the negative-side power supply terminal 124N that are connected to the positive terminal and the negative terminal of the DC power supply, and the three divided power supply terminal blocks 130A including the positive-side divided terminals 135P and the negative-side divided terminals 134N respectively connected to the positive-side electrode terminals Pm and the negative-side electrode terminals Nm of the three opening/closing modules 90A.

The composite circuit board 110A also has the positive-side first conductive plate 10P0 connected to the positive-side power supply terminal 125P, the negative-side second conductive plate 10N connected to the negative-side power supply terminal 124N having a polarity opposite to that of the positive-side power supply terminal 125P, and the front-side prepreg member 12PP configured to bond the positive-side first conductive plate 10P0 and the negative-side second conductive plate 10N while providing insulation.

The conductive plate through hole 10h0 and the surface layer through hole 12h, through which the connector of the negative-side lead terminal 101n of the unit capacitor 101 passes, are formed in the positive-side first conductive plate 10P0 and the front-side prepreg member 12PP.

The positive-side lead terminal 101p of each of the plurality of unit capacitors 101 being a surface mount device is soldered to the positive-side first conductive plate 10P0, and the negative-side lead terminal 101n of each of the plurality of unit capacitors 101 is soldered to the negative-side second conductive plate 10N.

The negative-side second conductive plate 10N is connected to the negative-side power supply terminal 124N and the negative-side divided terminal 134N, while the positive-side first conductive plate 10P0 is connected to the positive-side power supply terminal 125P and the positive-side divided terminal 135P.

Each of the plurality of unit capacitors 101 is formed of the conductive polymer solid aluminum electrolytic capacitor or the conductive polymer hybrid aluminum electrolytic capacitor.

A plurality of capacitor rows each including the plurality of unit capacitors 101 arrayed along a shorter side of the composite circuit board 110A are arrayed along a longer side of the composite circuit board 110A.

The three divided power supply terminal blocks 130A are arrayed along one of the longer sides of the composite circuit board 110A having a rectangular structure.

The total number of capacitor rows is two or more for one or a pair of the divided power supply terminal blocks 130A, and at least one common capacitor row is arranged between the divided power supply terminal blocks.

Capacitor substrate units for opening/closing modules according to the first embodiment to a fourth embodiment of the present application are different in the connection polarities of the first conductive plate and the second conductive plate and the number of opening/closing modules used. However, those capacitor substrate units are the same in that the first and second conductive plates are insulated and bonded by using the prepreg member and that a large number of arrayed unit capacitors are the conductive polymer aluminum electrolytic capacitors.

Through formation of the prepreg member into a film that is thin as compared to an insulating substrate in a typical circuit board, a high-frequency noise voltage is short-circuited and reduced by a parasitic capacitor generated in a distributed manner between the first conductive plate and the second conductive plate that are fixed by bonding, and a peripheral magnetic field is not generated because currents flow on the front-side and the back-side of the conductive plate in the opposite directions. Consequently, a wire path inductance and a voltage ripple are reduced, leading to addition of the effect of allowing the unit capacitors to have uniform temperature by a wide-area heat-transfer effect. Further, this reduction in the wire path inductance can reduce a loss and a surge voltage generated at the time of opening/closing of the element and in the opening/closing element.

The positive-side and negative-side divided terminals 135P and 135N are integrated by the divided power supply terminal block 130A fixed to the composite circuit board 110A.

The positive-side and negative-side divided terminals 135P and 135N are arranged facing the positive-side and negative-side electrode terminals Pm and Nm provided in the opening/closing module 90A on the joint surface for weld-joining with the positive-side and negative-side divided terminals 135P and 135N, and the joint surface is a plane orthogonal to the board plane of the composite circuit board 110A.

As described above, relating to claim 2 of the present invention, the positive-side and negative-side divided terminals provided in the divided power supply terminal block fixed to the composite circuit board and the positive-side and negative-side electrode terminals provided in the opening/closing module are arranged facing each other to construct the weld-joint surface, and this joint surface is orthogonal to the board plane of the composite circuit board.

Thus, the first embodiment has a feature in that an interval of installation between the composite circuit board and the opening/closing module is reduced and the respective terminals thereof are directly joined by welding to reduce wiring resistance and facilitate placement of a welding tool.

This also applies to the fourth embodiment.

The divided power supply terminal blocks 130A are arranged on a pair of longer sides of the composite circuit board 110A even when the three-phase AC motor has any of one and two sets of the three-phase windings, and a pair of three, a total of six, divided power supply terminal blocks 130A is used.

The positive-side first conductive plate 10P0 is connected to the positive-side power supply terminal 125P via the positive-side divided terminal 135P and the positive-side auxiliary conductive plate 10Pa.

The plate thickness of the positive-side first conductive plate 10P0 is smaller than the plate thickness of the negative-side second conductive plate 10N.

As described above, relating to claim 5 of the present invention, the plate thickness of the first conductive plate is smaller than that of the second conductive plate, but the first conductive plate is connected to the power supply terminal via the auxiliary conductive plate.

The conductive plate through hole, through which the connector of the lead terminal of the unit capacitor passes, is formed in the first conductive plate. The hole diameter of this conductive plate through hole needs to be increased in proportion to the plate thickness such that a solder resist film reliably insulates the inner peripheral surface of the conductive plate through hole. When the plate thickness is increased, the hole diameter increases to cause a decrease in integration density of the unit capacitors, and a difference in soldered surface between the first conductive plate side and the second conductive plate side increases, which necessitates formation of a step in the lead terminal of the unit capacitor.

However, the first embodiment has a feature in that, by using the auxiliary conductive plate to reduce the wiring resistance, it is possible to reduce the plate thickness of the first conductive plate, decrease the diameter of the hole thereof and increase the integration density of the unit capacitors, to thereby reduce the difference between the soldered surfaces.

This also applies to the fourth embodiment.

The positive-side auxiliary conductive plate 10Pa is fixed by bonding, via the intermediate prepreg member 13PP, to a surface of the negative-side second conductive plate 10N that is opposite to the surface to which the positive-side first conductive plate 10P0 is bonded via the front-side prepreg member 12PP.

The plate thickness of the positive-side auxiliary conductive plate 10Pa is equal to or smaller than the plate thickness of the negative-side second conductive plate 10N.

The plate thickness of the positive-side auxiliary conductive plate 10Pa is larger than the plate thickness of the positive-side first conductive plate 10P0.

To the positive-side auxiliary conductive plate 10Pa, the positive-side power supply terminal 125P provided on the DC power supply terminal block 120A is connected by soldering and the positive-side divided terminal 135P provided on the divided power supply terminal block 130A is connected by soldering.

The positive-side power supply terminal 125P and the positive-side divided terminal 135P are in abutment against and connected by soldering to the positive-side auxiliary conductive plate 10Pa by passing through the conductive plate through hole 10h0 formed in the positive-side first conductive plate 10P0, the surface layer through hole 12h formed in the front-side prepreg member 12PP, the negative-side plate through hole 10Nh formed in the negative-side second conductive plate 10N, and the intermediate layer through hole 13h formed in the intermediate prepreg member 13PP.

The positive-side divided terminal 135P is connected by soldering to the positive-side first conductive plate 10P0 via the branched coupling portion 135e.

As described above, relating to claim 6 of the present invention, the positive-side auxiliary conductive plate is fixed by bonding, via the intermediate prepreg member, to the surface of the negative-side second conductive plate that is opposite to the surface to which the positive-side first conductive plate is bonded via the front-side prepreg member. To this positive-side auxiliary conductive plate, the positive-side power supply terminal provided on the DC power supply terminal block is connected by soldering and the positive-side divided terminal provided on the divided power supply terminal block is connected by soldering. This positive-side divided terminal is connected by soldering to the positive-side first conductive plate via the branched coupling portion.

Thus, the first embodiment has a feature in that the positive-side power supply terminal and the positive-side first conductive plate are connected to each other via the branched coupling portion provided on the positive-side auxiliary conductive plate and the positive-side divided terminal, and even when the plate thickness of the positive-side first conductive plate is reduced, it is possible to reduce the wiring resistance against the unit capacitors in three groups corresponding to three divided power supply terminal blocks.

The first embodiment has a feature in that when three opening/closing modules are connected on each side of the composite circuit board, a potential difference between the two sides can be reduced even when the plate thickness of the positive-side or negative-side first conductive plate is reduced. The first embodiment also has a feature in that the wiring resistance can be reduced similarly even when six divided power supply terminal blocks and three opening/closing modules are provided.

The ground conductive plate 10G is fixed by bonding to the back surface of the positive-side auxiliary conductive plate 10Pa via the back-side prepreg member 14PP.

The composite circuit board 110A is fixed by pressing to the base plate 150 by using the mounting screws 110s, and the ground conductive plate 10G is joined to the base plate 150 via a heat-transfer grease 154 so as to transfer heat.

As described above, relating to claim 7 of the present invention, the ground conductive plate is fixed by bonding to the back surface of the positive-side auxiliary conductive plate via the back-side prepreg member, and this ground conductive plate is fixed by pressing to the base plate via the heat-transfer grease.

Thus, the first embodiment has a feature in that the heat generated in the plurality of unit capacitors is transferred and dispersed to the base plate through the high heat-transfer members including the first conductive plate, the second conductive plate, the auxiliary conductive plate, and the ground conductive plate, the front-side, intermediate, and back-side prepreg members, and the heat-transfer grease. The heat-transfer effect of the entire surface can be enhanced due to a reduction in thickness dimension of the prepreg member.

Detailed Description of Second Embodiment (1) Detailed Description of Configuration In the following, a detailed description is given of a configuration illustrated in FIG. 7, which is a configuration view of an entire capacitor substrate unit according to a second embodiment of the present invention by focusing on a difference from the configuration illustrated in FIG. 1, with reference to the partial detailed views of FIG. 8A to FIG. 11B.

In each drawing, the same or corresponding parts are denoted by the same reference symbols. The capacitor substrate unit 100A is changed to a capacitor substrate unit 100B, and the capital letter at the end of the reference symbol indicates which embodiment the unit belongs to.

Main differences between the first embodiment and the second embodiment are that the polarities of three layers of conductive plates including the positive-side first conductive plate 10P0, the negative-side second conductive plate 10N, and the positive-side auxiliary conductive plate 10Pa, are changed to form three layers of conductive plates including a negative-side first conductive plate 10N0, a positive-side second conductive plate 10P, and a negative-side auxiliary conductive plate 10Na, and that six opening/closing modules 90B connected to two sets of three-phase windings are used in place of the three opening/closing modules 90A connected to the set of three-phase windings.

Figure 7:
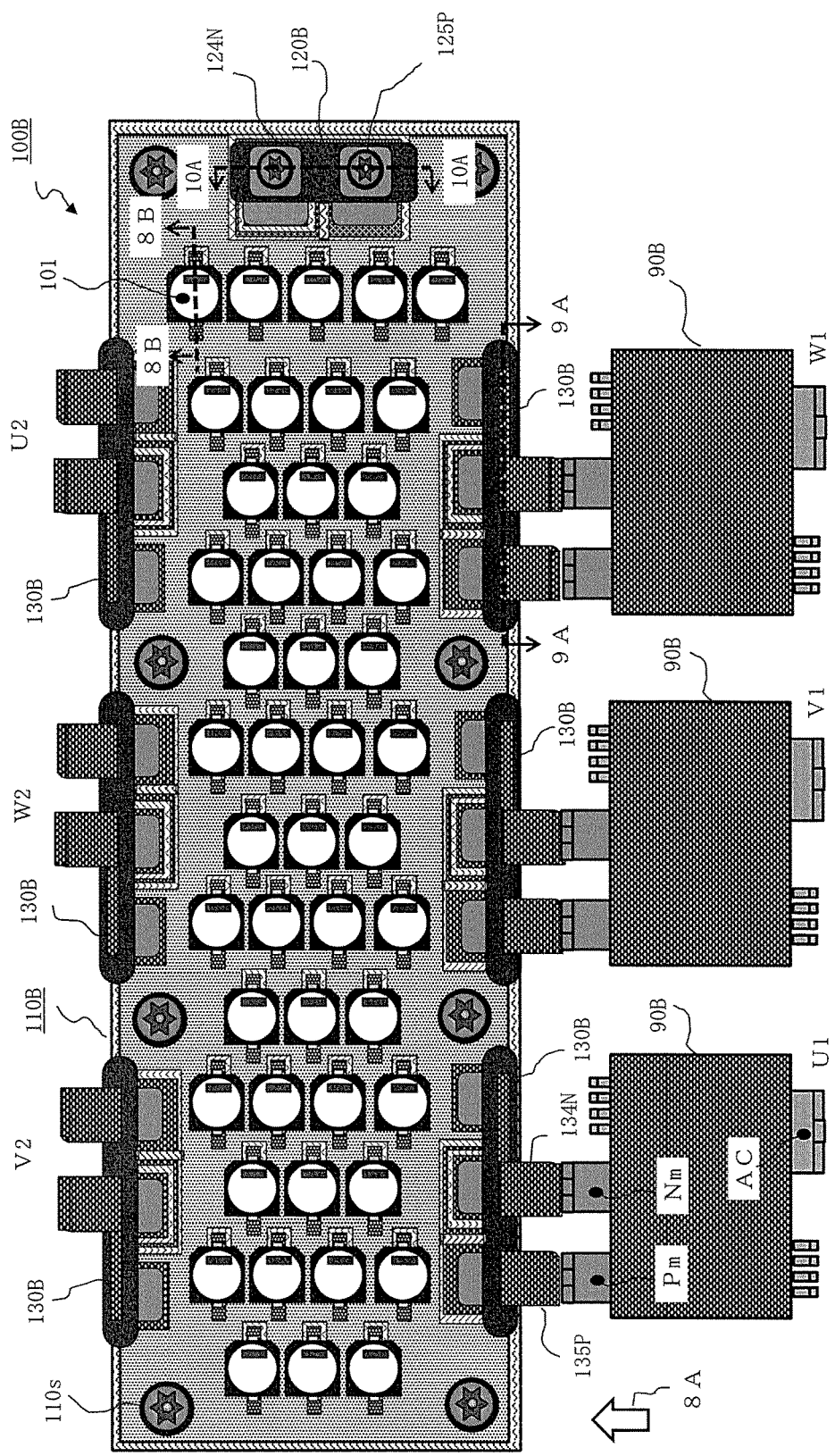
FIG. 7 is a configuration view of an entire capacitor substrate unit according to a second embodiment of the present invention.

In FIG. 7, a composite circuit board 110B, which is a main component of the capacitor substrate unit 100B, includes a plurality of laminate members described later with reference to FIG. 8A, and has a surface layer on which the plurality of unit capacitors 101 are connected in parallel to each other.

Three divided power supply terminal blocks 130B are mounted onto each of a pair of longer sides (hereinafter sometimes referred to as a lower side and an upper side) of the composite circuit board 110B having a rectangular shape, and a DC power supply terminal block 120B is mounted onto one shorter side of the composite circuit board 110B.

The composite circuit board 110B is mounted onto the base plate 150 (see FIG. 15A) and is fixed thereto via the mounting screws 110s.

A positive-side power supply terminal 125P and a negative-side power supply terminal 124N are integrally molded on the DC power supply terminal block 120B made of a resin mold member, and the respective power supply terminals are connected to a positive electrode terminal and a negative electrode terminal of the DC power supply being, for example, a DC48V on-vehicle battery (not shown).

Similarly, a positive-side divided terminal 135P and a negative-side divided terminal 134N are integrally molded on each of the six divided power supply terminal blocks 130B made of a resin mold member, and the respective divided terminals are joined by welding to the positive-side electrode terminal Pm and the negative-side electrode terminal Nm of each of the six opening/closing modules 90B described later with reference to FIG. 11A and FIG. 11B. However, illustration of the three opening/closing modules 90B on the upper side is omitted.

Further, the opening/closing modules 90B are connected to two sets of three-phase windings in a double three-phase AC motor (not shown) via the AC electrode terminals AC provided in the opening/closing modules 90B.

The array of the positive/negative terminals provided on the divided power supply terminal block 130B and the DC power supply terminal block 120B is different from the array of the positive/negative terminals provided on the divided power supply terminal block 130A and the DC power supply terminal block 120A, and hence the terminal arrangement between the opening/closing module 90B and the opening/closing module 90A is also different. However, when the opening/closing module 90B has the same terminal array as that of the opening/closing module 90A, the common opening/closing module can be used.

Figure 8A:
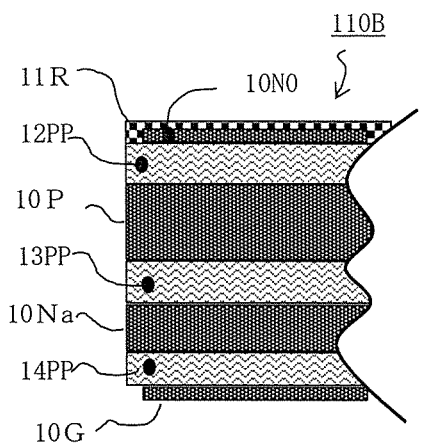
FIG. 8A is a side view of a composite circuit board viewed in a direction indicated by the arrow 8A of FIG. 7.
Figure 8B:
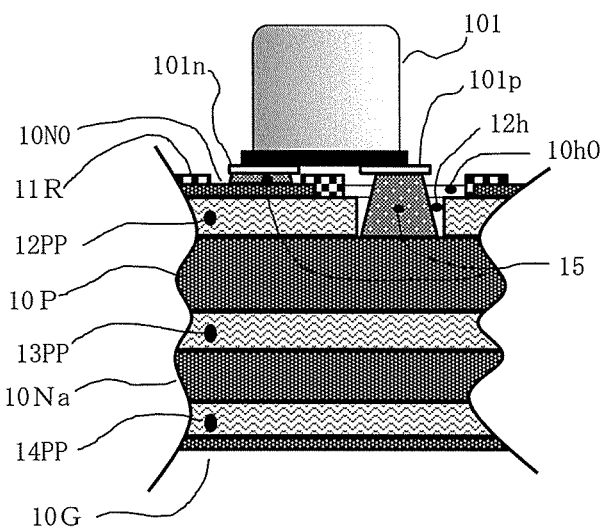
FIG. 8B is a cross-sectional view of the composite circuit board taken along the line 8B-8B of FIG. 7.

Next, a description is given of FIG. 8A being a side view of the composite circuit board viewed in a direction indicated by the arrow 8A of FIG. 7, and FIG. 8B being a cross-sectional view of the composite circuit board taken along the line 8B-8B of FIG. 7.

In FIG. 8A and FIG. 8B, the conductive plate has a three-layered structure of the negative-side first conductive plate 10N0, the positive-side second conductive plate 10P, and the negative-side auxiliary conductive plate 10Na. The negative-side lead terminal 101n of the unit capacitor 101 is connected by soldering to the negative-side first conductive plate 10N0, and the positive-side lead terminal 101p is connected by soldering to the positive-side second conductive plate 10P.

Figure 9A:
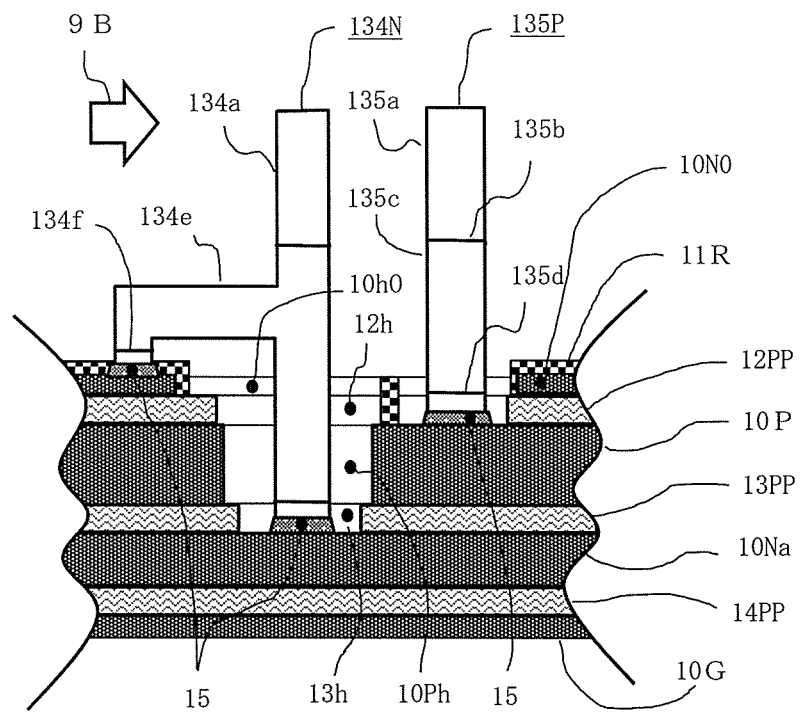
FIG. 9A is a cross-sectional view of the composite circuit board taken along the line 9A-9A of FIG. 7.
Figure 9B:
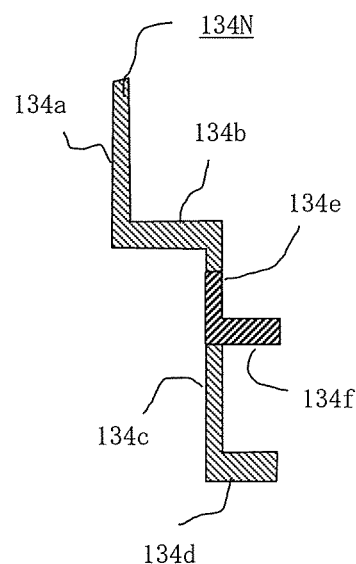
FIG. 9B is a side view of a negative-side divided terminal viewed in a direction indicated by the arrow 9B of FIG. 9A.

Next, a description is given of FIG. 9A being a cross-sectional view of the composite circuit board taken along the line 9A-9A of FIG. 7, and FIG. 9B being a side view of the negative-side divided terminal viewed in a direction indicated by the arrow 9B of FIG. 9A.

In FIG. 9A and FIG. 9B, the negative-side divided terminal 134N includes the shelf plate portion 134b that is orthogonally bent from the module connector 134a, the orthogonal portion 134c that is orthogonally bent again to be parallel to the module connector 134a, and the negative-side connector 134d that is orthogonally bent from the orthogonal portion 134c. This negative-side connector 134d and the negative-side auxiliary conductive plate 10Na are arranged in parallel and connected by soldering to each other by using the solder 15.

A branched coupling portion 134e is provided at the intermediate position of the orthogonal portion 134c, and a through connector 134f that is parallel to the negative-side first conductive plate 10N0 is provided at the distal position of the branched coupling portion 134e, so as to be connected by soldering to the negative-side first conductive plate 10N0 by using the solder 15.

The orthogonal portion 134c passes through the conductive plate through hole 10h0 formed in the negative-side first conductive plate 10N0, the surface layer through hole 12h formed in the front-side prepreg member 12PP, a positive-side plate through hole 12Ph formed in the positive-side second conductive plate 10P, and the intermediate layer through hole 13h formed in the intermediate prepreg member 13PP. The negative-side connector 134d and the through hole connector 134f connect the negative-side auxiliary conductive plate 10Na to the negative-side first conductive plate 10N0.

Figure 10A:
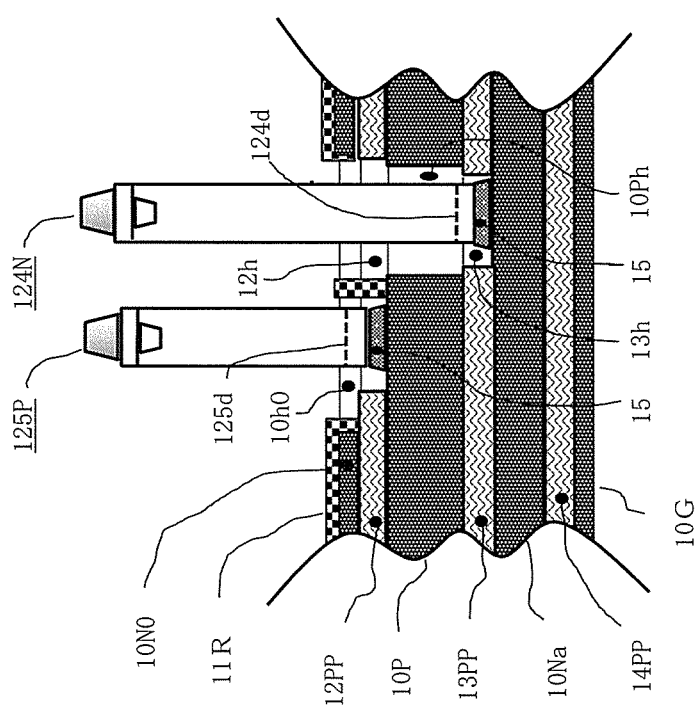
FIG. 10A is a cross-sectional view of the composite circuit board taken along the line 10A-10A of FIG. 7.

The negative-side auxiliary conductive plate 10Na is connected to the negative-side power supply terminal 124N, as illustrated in FIG. 10A described later.

Meanwhile, the positive-side divided terminal 135P includes the shelf plate portion 135b that is orthogonally bent from the module connector 135a, the orthogonal portion 135c that is orthogonally bent again to be parallel to the module connector 135a, and the positive-side connector 135d that is orthogonally bent from the orthogonal portion 135c. This positive-side connector 135d and the positive-side second conductive plate 10P are arranged in parallel and connected by soldering to each other by using the solder 15.

The orthogonal portion 135c passes through the conductive plate through hole 10h0 formed in the negative-side first conductive plate 10N0 and the surface layer through hole 12h formed in the front-side prepreg member 12PP.

The positive-side second conductive plate 10P is connected to the positive-side power supply terminal 125P as illustrated in FIG. 10A described later.

Next, a description is given of FIG. 10A being a cross-sectional view of the composite circuit board taken along the line 10A-10A of FIG. 7.

In FIG. 10A, the negative-side power supply terminal 124N passes through the conductive plate through hole 10h0 formed in the negative-side first conductive plate 10N0, the surface layer through hole 12h formed in the front-side prepreg member 12PP, a positive-side plate through hole 10Ph formed in the positive-side second conductive plate 10P, and the intermediate layer through hole 13h formed in the intermediate prepreg member 13PP. The negative-side connector 124d arranged in parallel to the negative-side auxiliary conductive plate 10Na is provided, and the negative-side auxiliary conductive plate 10Na and the negative-side connector 124d are connected by soldering by using the solder 15.

The positive-side power supply terminal 125P passes through the conductive plate through hole 10h0 formed in the negative-side first conductive plate 10N0 and the surface layer through hole 12h formed in the front-side prepreg member 12PP. The positive-side connector 125d arranged in parallel to the positive-side second conductive plate 10P is provided. The positive-side second conductive plate 10P and the positive-side connector 125d are connected by soldering by using the solder 15.

Accordingly, the positive-side power supply terminal 125P, the six positive-side divided terminals 135P, and the positive-side lead terminals 101p of the plurality of unit capacitors 101 are electrically connected in an integrated manner, and the negative-side power supply terminal 124N, the six negative-side divided terminals 134N, and the negative-side lead terminals 101n of the plurality of unit capacitors 101 are electrically connected in an integrated manner.

Figure 11A:
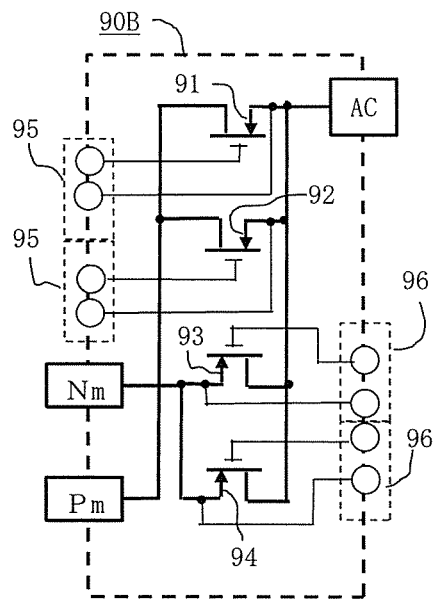
FIG. 11A is an internal configuration diagram of an opening/closing module illustrated in FIG. 7.
Figure 11B:
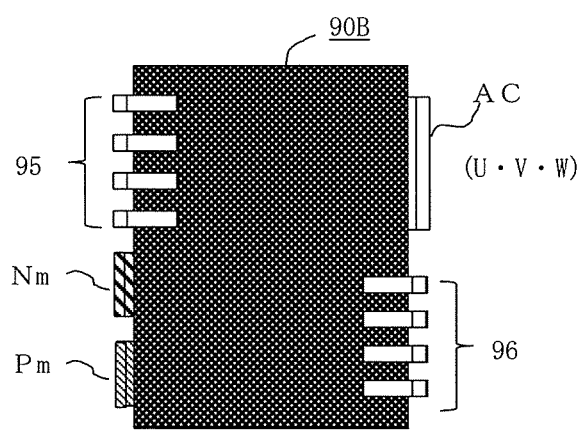
FIG. 11B is an external view for illustrating a terminal arrangement of the opening/closing module illustrated in FIG. 7.

Next, a description is given of FIG. 11A being an internal configuration diagram of the opening/closing module 90B illustrated in FIG. 7, and FIG. 11B being an external view for illustrating a terminal arrangement of the opening/closing module 90B.

In FIG. 11A, the opening/closing module 90B mainly includes the parallel circuit of the first and second upstream opening/closing elements 91 and 92, which are connected between the positive-side electrode terminal Pm and the AC electrode terminal AC, and the parallel circuit of the first and second downstream opening/closing elements 93 and 94, which are connected between the negative-side electrode terminal Nm and the AC electrode terminal AC. An N-channel type field effect transistor is used for each opening/closing element.

A first or second gate signal for driving to close the first and second upstream opening/closing elements 91 and 92 is provided from the control circuit portion 140 (see FIG. 15A) to the pair of upstream gate drive terminals 95 and 95. In addition, a first or second gate signal for driving to close the first and second downstream opening/closing elements 93 and 94 is provided from the control circuit portion 140 (see FIG. 15A) to the pair of downstream gate drive terminals 96 and 96.

In FIG. 11B, the opening/closing module 90B is subjected to resin sealing and integrated. The positive-side electrode terminal Pm, the negative-side electrode terminal Nm, and the upstream gate drive terminal 95 are provided on one side of right and left sides on the opposite positions. The AC electrode terminal AC and the downstream gate drive terminal 96 are provided on another side.

The positive-side electrode terminal Pm and the negative-side electrode terminal Nm are connected by welding to the six positive-side divided terminals 135P and the six negative-side divided terminals 134N in two sets as illustrated in FIG. 7. The AC electrode terminal AC is connected to each of a first set of three-phase windings U1, V1, and W1 and a second set of three-phase windings U2, V2, and W2 of a double three-phase AC motor (not shown) via an external wiring terminal (not shown).

When the three-phase AC motor has a set of three-phase windings and uses three opening/closing modules with respect thereto, the upstream opening/closing elements 91 and 92 and the downstream opening/closing elements 93 and 94 are connected in parallel to each other and used. However, when the three-phase AC motor has two sets of three-phase windings with the same output capacity, one upstream opening/closing element and one downstream opening/closing elements can be used.

(2) Main Points and Features of Second Embodiment

As apparent from the above description, the capacitor substrate unit according to the second embodiment of the present invention is the capacitor substrate unit 100B for opening/closing modules, which is connected between the DC power supply and the six opening/closing modules 90B each having the opening/closing element built-in, and includes the plurality of unit capacitors 101 connected in parallel to each other on the composite circuit board 110B to perform power supply smoothing. The opening/closing element is configured to convert DC power obtained from the DC power supply to AC power so as to drive a double three-phase AC motor.

The composite circuit board 110B has the DC power supply terminal block 120B including the positive-side power supply terminal 125P and the negative-side power supply terminal 124N that are connected to the positive terminal and the negative terminal of the DC power supply, and the six divided power supply terminal blocks 130B including the positive-side divided terminals 135P and the negative-side divided terminals 134N respectively connected to the positive-side electrode terminals Pm and the negative-side electrode terminals Nm of the six opening/closing modules 90B.

The composite circuit board 110B also has the negative-side first conductive plate 10N0 connected to the negative-side power supply terminal 124N, the positive-side second conductive plate 10P connected to the positive-side power supply terminal 125P having a polarity opposite to that of the negative-side power supply terminal 124N, and the front-side prepreg member 12PP configured to bond the negative-side first conductive plate 10N0 and the positive-side second conductive plate 10P while providing insulation.

The conductive plate through hole 10h0 and the surface layer through hole 12h, through which the connector of the positive-side lead terminal 101p of the unit capacitor 101 passes, are formed in the negative-side first conductive plate 10N0 and the front-side prepreg member 12PP.

The negative-side lead terminal 101n of each of the plurality of unit capacitors 101 being a surface mount device is soldered to the negative-side first conductive plate 10N0, and the positive-side lead terminal 101p of each of the plurality of unit capacitors 101 is soldered to the positive-side second conductive plate 10P.

The positive-side second conductive plate 10P is connected to the positive-side power supply terminal 125P and the positive-side divided terminal 135P, while the negative-side first conductive plate 10N0 is connected to the negative-side power supply terminal 124N and the negative-side divided terminal 134N.

Each of the plurality of unit capacitors 101 is formed of the conductive polymer solid aluminum electrolytic capacitor or the conductive polymer hybrid aluminum electrolytic capacitor. A plurality of capacitor rows each including the plurality of unit capacitors 101 arrayed along a shorter side of the composite circuit board 110B are arrayed along a longer side of the composite circuit board 110B.

A pair of three, a total of six, divided power supply terminal blocks 130B is arrayed along two longer sides of the composite circuit board 110B having a rectangular structure.

The total number of capacitor rows is two or more for one or a pair of the divided power supply terminal blocks 130B, and at least one common capacitor row is arranged between the divided power supply terminal blocks.

The positive-side and negative-side divided terminals 135P and 135N are integrated by the divided power supply terminal block 130B fixed to the composite circuit board 110B.

The positive-side and negative-side divided terminals 135P and 135N are arranged facing the positive-side and negative-side electrode terminals Pm and Nm provided in the opening/closing module 90B on the joint surface for weld-joining with the positive-side and negative-side divided terminals 135P and 135N, and the joint surface is a plane orthogonal to the board plane of the composite circuit board 110B.

As described above, relating to claim 2 of the present invention, the positive-side and negative-side divided terminals provided in the divided power supply terminal block fixed to the composite circuit board and the positive-side and negative-side electrode terminals provided in the opening/closing module are arranged facing each other to construct the weld-joint surface, and this joint surface is orthogonal to the board plane of the composite circuit board.

Thus, the second embodiment has a feature in that an interval of installation between the composite circuit board and the opening/closing module is reduced and the respective terminals thereof are directly joined by welding to reduce wiring resistance and facilitate placement of a welding tool.

This also applies to a third embodiment of the present invention.

A total of six divided power supply terminal blocks 130B are arrayed along each of a pair of longer sides of the rectangle of the composite circuit board 110B.

The opening/closing module 90B constructs a half-bridge circuit having a square shape. The half-bridge circuit includes the upstream opening/closing elements 91 and 92 connected to the positive-side electrode terminal Pm, the downstream opening/closing elements 93 and 94 connected to the negative-side electrode terminal Nm, the upstream gate drive terminal 95 with respect to the upstream opening/closing elements 91 and 92, the downstream gate drive terminal 96 with respect to the downstream opening/closing elements 93 and 94, and the AC electrode terminal AC, which is provided at a connecting point of the upstream opening/closing elements 91 and 92, and the downstream opening/closing elements 93 and 94, and is connected to one of phase windings of the three-phase AC motor.

The positive-side electrode terminal Pm and the negative-side electrode terminal Nm are arranged in a biased manner on one side of opposite sides of the square.

The AC electrode terminal AC is arranged in a biased manner on another side of the opposite sides.

The upstream gate drive terminal 95 and the downstream gate drive terminal 96 are the positive-side electrode terminal Pm and the negative-side electrode terminal Nm or are arranged side by side with the AC electrode terminal on one side and another side of the opposite sides of the square.

As described above, relating to claim 3 of the present invention, the positive-side electrode terminal Pm and the negative-side electrode terminal Nm are arranged in a biased manner on one side of the opening/closing module having a square shape.

Thus, when the same opening/closing modules are arranged on the upper and lower longer sides of the composite circuit board being an aggregate of the unit capacitors, the positive-side electrode terminal Pm and the negative-side electrode terminal Nm of one opening/closing module are provided on the left or right of the positive-side electrode terminal Pm and the negative-side electrode terminal Nm of another opening/closing module in crisscross arrangement, so as to face a unit capacitor group including unit capacitors in a different group area.

Thus, the second embodiment has a characteristic in which an effective capacitor capacity can be increased by arranging the positive-side electrode terminal Pm and the negative-side electrode terminal Nm so as to face a wide-area unit capacitor group as compared to a case in which the positive-side electrode terminal Pm and the negative-side electrode terminal Nm of the opening/closing module are arranged in an intermediate portion of the square.

This also applies to the third embodiment.

In the three-phase AC motor that has a plurality sets of, a first set and a second set of, three-phase windings, and in which a pair of three-phase AC voltages with no phase difference or a predetermined phase difference α therebetween is applied to the plurality of sets of three-phase windings, three of the opening/closing modules 90B in the first set, which are arranged on one longer side of the composite circuit board 110B to supply electricity to the three-phase windings in the first set, and three of the opening/closing modules 90B in the second set, which are arranged on another longer side of the composite circuit board 110B to supply electricity to the three-phase windings in the second set are connected in crisscross arrangement with one phase shift between the opening/closing modules 90B in the first set and the second set.

As described above, relating to claim 4 of the present invention, the opening/closing modules arranged on one longer side of the composite circuit board are arranged in the order of the U1 phase, the V1 phase, and the W1 phase, for example, whereas the opening/closing modules arranged on another longer side of the composite circuit board are arranged in the order of the V2 phase, the W2 phase, and the U2 phase, for example. The opening/closing modules of the U1 phase and the V2 phase, the opening/closing modules of the V1 phase and the W2 phase, and the opening/closing modules of the W1 phase and the U2 phase face each other with the composite circuit board placed therebetween.

Therefore, when a comparison is made, for example, between a case in which the phase difference α=0 and the opening/closing modules of the same phases are arrayed on both sides and a case in which the opening/closing modules are arranged with a shift of one phase being 120 degrees, the maximum load current flows at the same time in the opening/closing modules on both sides when the opening/closing modules of the same phase are arrayed. However, with the phase difference of 120 degrees, when the load current of the opening/closing module on one side is the maximum, the load current of the opening/closing module on another side is zero, and the maximum load current obtained by adding up the load currents on both sides is reduced by a half corresponding to the maximum load current of one opening/closing module.

Accordingly, the second embodiment has a feature in that a ripple current generated in a plurality of unit capacitor groups arranged between this pair of opening/closing modules can be significantly reduced.

When the opening/closing modules are arranged with the phase difference α, it is appropriate to set the phase difference α to 30 degrees and set a phase difference between a pair of opening/closing modules on both sides to 120+30 degrees.

This also applies to the third embodiment.

The divided power supply terminal blocks 130B are arranged on a pair of longer sides of the composite circuit board 110B even when the three-phase AC motor has any of one and two sets of the three-phase windings, and a pair of three, a total of six, divided power supply terminal blocks 130B is used.

The negative-side first conductive plate 10N0 is connected to the negative-side power supply terminal 124N via the negative-side divided terminal 134N and the negative-side auxiliary conductive plate 10Na.

The plate thickness of the negative-side first conductive plate 10N0 is smaller than the plate thickness of the positive-side second conductive plate 10P.

As described above, relating to claim 5 of the present invention, the plate thickness of the first conductive plate is smaller than that of the second conductive plate, but the first conductive plate is connected to the power supply terminal via the auxiliary conductive plate.

The conductive plate through hole, through which the connector of the lead terminal of the unit capacitor passes, is formed in the first conductive plate. The hole diameter of this conductive plate through hole needs to be increased in proportion to the plate thickness such that a solder resist film reliably insulates the inner peripheral surface of the conductive plate through hole. When the plate thickness is increased, the hole diameter increases to cause a decrease in integration density of the unit capacitors, and a difference in soldered surface between the first conductive plate side and the second conductive plate side increases, which necessitates formation of a step in the lead terminal of the unit capacitor.

However, the second embodiment has a feature in that, by using the auxiliary conductive plate to reduce the wiring resistance, it is possible to reduce the plate thickness of the first conductive plate, decrease the diameter of the hole thereof, and increase the integration density of the unit capacitors, to thereby reduce the difference between the soldered surfaces.

This also applies to the third embodiment.

The negative-side auxiliary conductive plate 10Na is fixed by bonding, via the intermediate prepreg member 13PP, to a surface of the positive-side second conductive plate 10P that is opposite to the surface to which the negative-side first conductive plate 10N0 is bonded via the front-side prepreg member 12PP.

The plate thickness of the negative-side auxiliary conductive plate 10Na is equal to or smaller than the plate thickness of the positive-side second conductive plate 10P.

The plate thickness of the negative-side auxiliary conductive plate 10Na is larger than the plate thickness of the negative-side first conductive plate 10N0.

To the negative-side auxiliary conductive plate 10Na, the negative-side power supply terminal 124N provided on the DC power supply terminal block 120B is connected by soldering and the negative-side divided terminal 134N provided on the divided power supply terminal block 130B is connected by soldering.

The negative-side power supply terminal 124N and the negative-side divided terminal 134N are in abutment against and connected by soldering to the negative-side auxiliary conductive plate 10Na by passing through the conductive plate through hole 10h0 formed in the negative-side first conductive plate 10N0, the surface layer through hole 12h formed in the front-side prepreg member 12PP, the positive-side plate through hole 10Ph formed in the positive-side second conductive plate 10P, and the intermediate layer through hole 13h formed in the intermediate prepreg member 13PP.

The negative-side divided terminal 134N is connected by soldering to the negative-side first conductive plate 10N0 via the branched coupling portion 134e.

As described above, relating to claim 6 of the present invention, the negative-side auxiliary conductive plate is fixed by bonding, via the intermediate prepreg member, to the surface of the positive-side second conductive plate that is opposite to the surface to which the negative-side first conductive plate is bonded via the front-side prepreg member. To this negative-side auxiliary conductive plate, the negative-side power supply terminal provided on the DC power supply terminal block is connected by soldering and the negative-side divided terminal provided on the divided power supply terminal block is connected by soldering. This negative-side divided terminal is connected by soldering to the negative-side first conductive plate via the branched coupling portion.

Thus, the second embodiment has a feature in that the negative-side power supply terminal and the negative-side first conductive plate are connected to each other via the branched coupling portion provided on the negative-side auxiliary conductive plate and the negative-side divided terminal, and even when the plate thickness of the negative-side first conductive plate is reduced, it is possible to reduce the wiring resistance against the unit capacitors in three groups corresponding to a pair of three, a total of six, divided power supply terminal blocks.

The second embodiment has a feature in that when three opening/closing modules are connected on each side of the composite circuit board, a potential difference between the two sides can be reduced even when the plate thickness of the negative-side first conductive plate is reduced. The second embodiment also has a feature in that the wiring resistance can be reduced similarly even when six divided power supply terminal blocks and three opening/closing modules are provided.

The ground conductive plate 10G is fixed by bonding to the back surface of the negative-side auxiliary conductive plate 10Na via the back-side prepreg member 14PP.

The composite circuit board 110B is fixed by pressing to the base plate 150 by using the mounting screws 110s, and the ground conductive plate 10G is joined to the base plate 150 via the heat-transfer grease 154 so as to transfer heat.

As described above, relating to claim 7 of the present invention, the ground conductive plate is fixed by bonding to the back surface of the negative-side auxiliary conductive plate via the back-side prepreg member, and this ground conductive plate is fixed by pressing to the base plate via the heat-transfer grease.

Thus, the second embodiment has a feature in that the heat generated in the plurality of unit capacitors is transferred and dispersed to the base plate through the high heat-transfer members including the first conductive plate, the second conductive plate, the auxiliary conductive plate, and the ground conductive plate, the front-side, intermediate, and back-side prepreg members, and the heat-transfer grease. The heat-transfer effect of the entire surface can be enhanced due to a reduction in thickness dimension of the prepreg member.

Detailed Description of Third Embodiment (1) Detailed Description of Configuration In the following, a detailed description is given of a configuration illustrated in FIG. 12, which is a configuration view of an entire capacitor substrate unit according to the third embodiment of the present invention by focusing on a difference from the configuration illustrated in FIG. 1, with reference to the partial detailed views of FIG. 13A to FIG. 15A.

In each drawing, the same or corresponding parts are denoted by the same reference symbols. The capacitor substrate unit 100A is changed to a capacitor substrate unit 100C, and the capital letter at the end of the reference symbol indicates which embodiment the unit belongs to.

Main differences between the first embodiment and the third embodiment are that polarities of three layers of conductive plates including the positive-side first conductive plate 10P0, the negative-side second conductive plate 10N, and the positive-side auxiliary conductive plate 10Pa are changed to form two layers of conductive plates including the negative-side first conductive plate 10N0 and the positive-side second conductive plate 10P, and that six opening/closing modules 90A connected to two sets of three-phase windings are added to three opening/closing modules 90A connected to a set of three-phase windings, while the negative-side auxiliary conductive plate 10Nb is provided externally.

Figure 12:
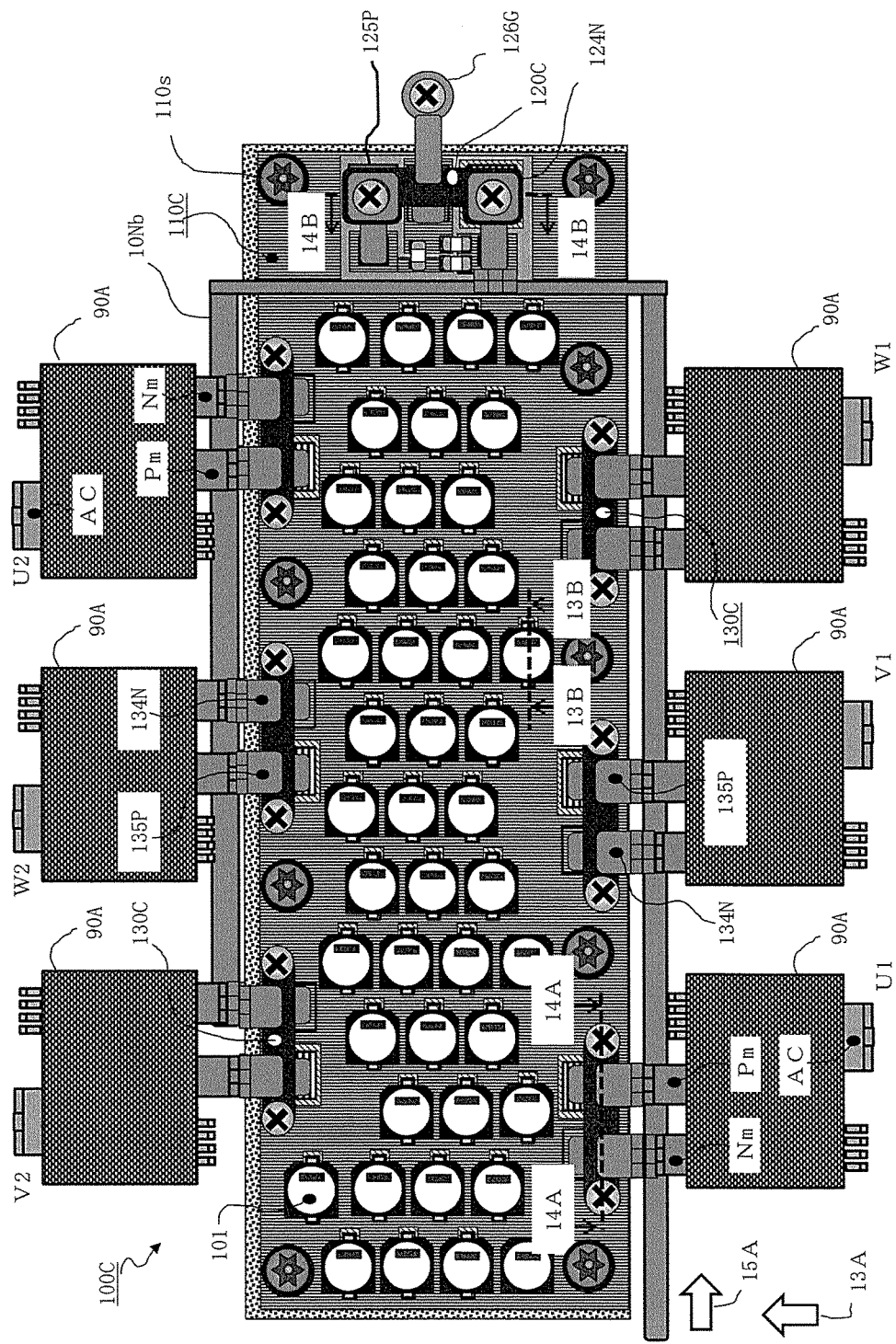
FIG. 12 is a configuration view of an entire capacitor substrate unit according to a third embodiment of the present invention.

In FIG. 12, a composite circuit board 110C, which is a main component of the capacitor substrate unit 100C, includes a plurality of laminate members described later with reference to FIG. 13A, and has a surface layer on which the plurality of unit capacitors 101 are connected in parallel to each other.

Three divided power supply terminal blocks 130C are mounted onto each of a pair of longer sides (hereinafter sometimes referred to as a lower side and an upper side) of the composite circuit board 110C having a rectangular shape, and a DC power supply terminal block 120C is mounted onto one shorter side of the composite circuit board 110C.

The negative-side power supply terminal 124N provided on the DC power supply terminal block 120C and the negative-side divided terminal 134N provided in each of the six divided power supply terminal blocks 130C are connected to each other by the negative-side auxiliary conductive plate 10Nb, and the composite circuit board 110C is mounted onto the base plate 150 (see FIG. 15A) and is fixed thereto via the mounting screws 110s.

The positive-side power supply terminal 125P and the negative-side power supply terminal 124N are integrally molded on the DC power supply terminal block 120C made of a resin mold member, and the respective power supply terminals are connected to a positive electrode terminal and a negative electrode terminal of the DC power supply being, for example, a DC48V on-vehicle battery (not shown).

Similarly, the positive-side divided terminal 135P and the negative-side divided terminal 134N are integrally molded on each of the six divided power supply terminal blocks 130C made of a resin mold member, and the respective divided terminals are joined by welding to the positive-side electrode terminal Pm and the negative-side electrode terminal Nm of each of the six opening/closing modules 90A described above with reference to FIGS. 6A and 6B.

Further, the opening/closing modules 90A are connected to two sets of three-phase windings in a double three-phase AC motor (not shown) via the AC electrode terminals AC provided in the opening/closing modules 90A.

The array of the positive/negative terminals provided on the divided power supply terminal block 130C and the DC power supply terminal block 120C is the same as the array of the positive/negative terminals provided on the divided power supply terminal block 130A and the DC power supply terminal block 120A, and hence the opening/closing module 90A in the same form as in the case of FIG. 1 is used.

However, when the output capacity of the three-phase AC motor is the same, the parallel connection of the upstream opening/closing elements 91 and 92, and the downstream opening/closing elements 93 and 94 in the opening/closing module 90A in FIG. 12 is unnecessary.

Figure 13A:
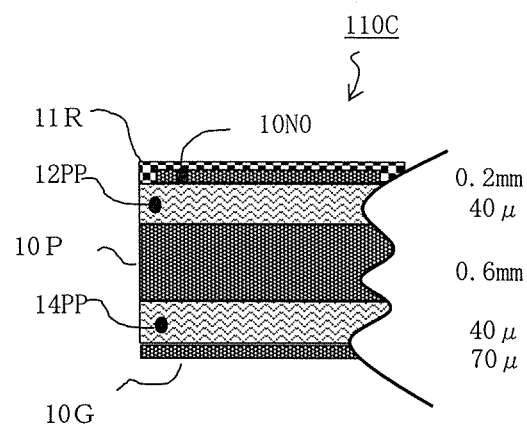
FIG. 13A is a side view of a composite circuit board viewed in a direction indicated by the arrow 13A of FIG. 12.
Figure 13B:
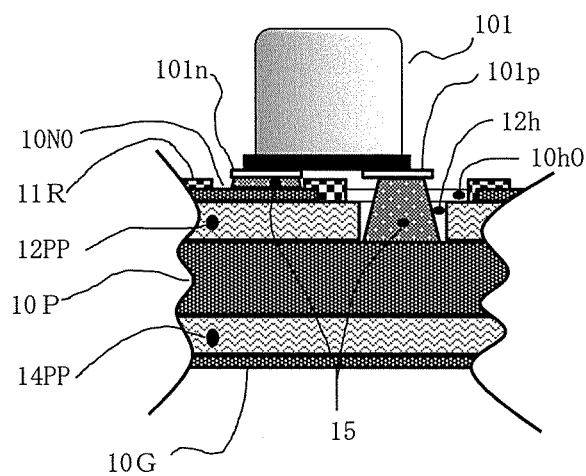
FIG. 13B is a cross-sectional view of the composite circuit board taken along the line 13B-13B of FIG. 12.

Next, a description is given of FIG. 13A being a side view of the composite circuit board viewed in a direction indicated by the arrow 13A of FIG. 12, and FIG. 13B being a cross-sectional view of the composite circuit board taken along the line 13B-13B of FIG. 12.

In FIG. 13A and FIG. 13B, the conductive plate has a two-layered structure of the negative-side first conductive plate 10N0 and the positive-side second conductive plate 10P. The negative-side lead terminal 101n of the unit capacitor 101 is connected by soldering to the negative-side first conductive plate 10N0, and the positive-side lead terminal 101p is connected by soldering to the positive-side second conductive plate 10P.

The negative-side auxiliary conductive plate 10Na and the intermediate prepreg member 13PP illustrated in FIG. 8A are eliminated, and instead of those components, the negative-side auxiliary conductive plate 10Nb illustrated in FIG. 12 is provided.

Figure 14A:
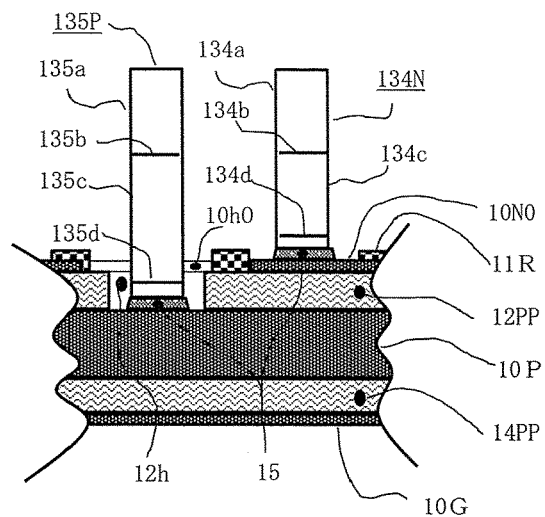
FIG. 14A is a cross-sectional view of the composite circuit board taken along the line 14A-14A of FIG. 12.
Figure 14B:
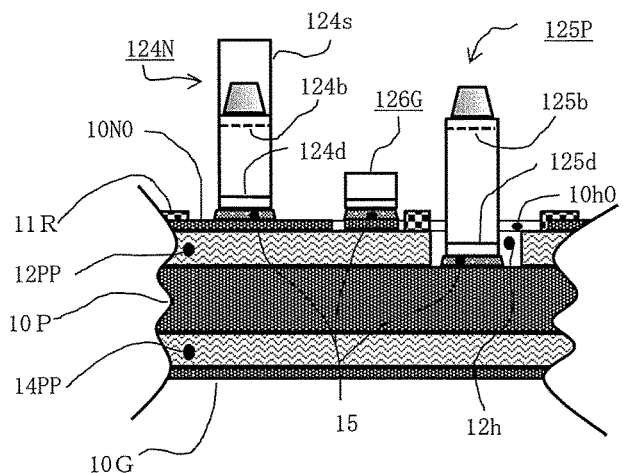
FIG. 14B is a cross-sectional view of the composite circuit board taken along the line 14B-14B of FIG. 12.
Figure 14C:
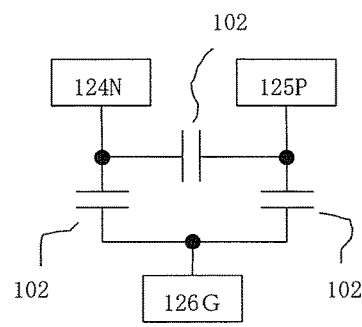
FIG. 14C is a circuit diagram of a ground capacitor illustrated in FIG. 12.

Next, a description is given of FIG. 14A being a cross-sectional view of the composite circuit board taken along the line 14A-14A of FIG. 12, FIG. 14B being a cross-sectional view of the composite circuit board taken along the line 14B-14B of FIG. 12, and FIG. 14C being a circuit diagram of a ground capacitor illustrated in FIG. 12.

In FIG. 14A, the negative-side divided terminal 134N includes the shelf plate portion 134b that is orthogonally bent from the module connector 134a, the orthogonal portion 134c that is orthogonally bent again to be parallel to the module connector 134a, and the negative-side connector 134d that is orthogonally bent from the orthogonal portion 134c. This negative-side connector 134d and the negative-side first conductive plate 10N0 are arranged in parallel and connected by soldering to each other by using the solder 15.

Further, the positive-side divided terminal 135P includes the shelf plate portion 135b that is orthogonally bent from the module connector 135a, the orthogonal portion 135c that is orthogonally bent again to be parallel to the module connector 135a, and the positive-side connector 135d that is orthogonally bent from the orthogonal portion 135c. This positive-side connector 135d and the positive-side second conductive plate 10P are arranged in parallel and connected by soldering to each other by using the solder 15.

The orthogonal portion 135c passes through the conductive plate through hole 10h0 formed in the negative-side first conductive plate 10N0 and the surface layer through hole 12h formed in the front-side prepreg member 12PP.

As illustrated in FIG. 14B described later, the positive-side second conductive plate 10P is connected to the positive-side power supply terminal 125P. The negative-side first conductive plate 10N0 is connected to the negative-side power supply terminal 124N via the negative-side auxiliary conductive plate 10Nb (see FIG. 12).

In FIG. 14B, the negative-side power supply terminal 124N includes an auxiliary plate connector 124s, a shelf plate portion 124b, and the negative-side connector 124d, and the negative-side connector 124d is in abutment against the negative-side first conductive plate 10N0 and is soldered thereto by using the solder 15.

The positive-side power supply terminal 125P passes through the conductive plate through hole 10h0 formed in the negative-side first conductive plate 10P0 and the surface layer through hole 12h formed in the front-side prepreg member 12PP. The positive-side connector 125d arranged in parallel to the positive-side second conductive plate 10P is provided. The positive-side second conductive plate 10P and the positive-side connector 125d are connected by soldering by using the solder 15.

Accordingly, the positive-side power supply terminal 125P, the six positive-side divided terminals 135P, and the positive-side lead terminals 101p of the plurality of unit capacitors 101 are electrically connected in an integrated manner, and the negative-side power supply terminal 124N, the six negative-side divided terminals 134N, and the negative-side lead terminals 101n of the plurality of unit capacitors 101 are electrically connected in an integrated manner.

In FIG. 14C and FIG. 12, noise absorption capacitors 102, for example, ceramic capacitors, are connected between the positive-side power supply terminal 125P and an earth terminal 126G, and between the negative-side power supply terminal 124N and the earth terminal 126G.

This noise absorption capacitor 102 is for preventing occurrence of a failure due to electric shock by reducing a surge voltage that flows on the positive-side and negative-side power supply lines associated with intermittent operation of the opening/closing element. Illustration of the noise absorption capacitor 102 is omitted in FIG. 1 and FIG. 7.

Adding a description with reference to FIG. 14A and FIG. 14B to the description of the divided power supply terminal block 130C and the DC power supply terminal block 120C in FIG. 12, a resin member, which is formed by integrally molding the positive-side and negative-side divided terminals 135P and 134N, and the positive-side and negative-side divided terminals 125P and 124N, is fixed by bonding to the surface of the composite circuit board 110C by screwing or using an adhesive, preferably fixed by bonding directly to the surface of the positive-side second conductive plate 10P in which the negative-side first conductive plate 10N0 and the front-side prepreg member 12PP have been removed, so as to reduce external force that acts on the solder joint surface.

In the case of screwing, a nut is soldered to the surface of the positive-side second conductive plate 10P in advance, and a fixing screw on the terminal block is screwed into this nut.

Figure 15A:
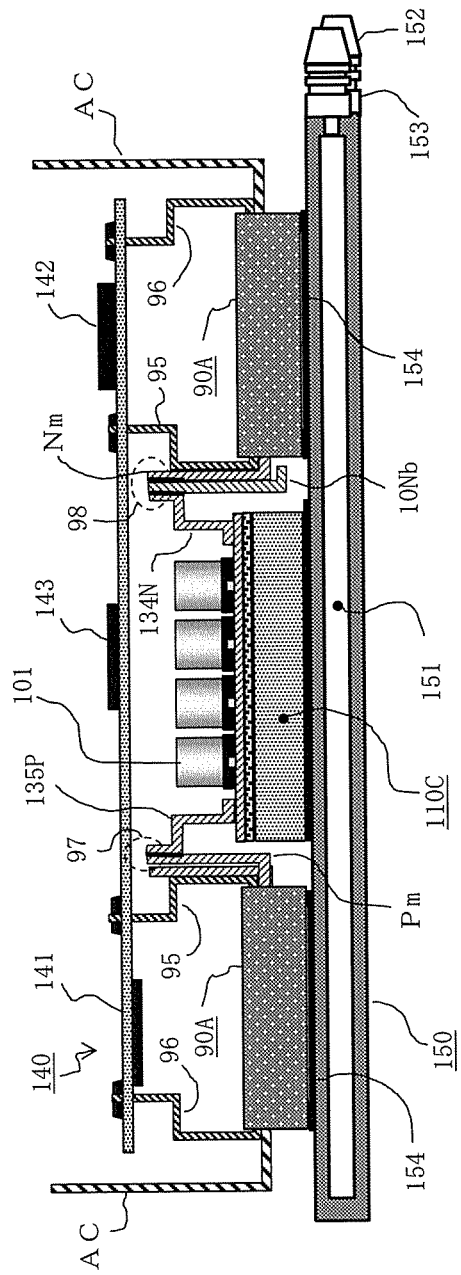
FIG. 15A is a side view of mounting viewed in a direction indicated by the arrow 15A of FIG. 12.

Next, a description is given of FIG. 15A being a side view of mounting viewed in a direction indicated by the arrow 15A of FIG. 12.

In FIG. 15A, the composite circuit board 110C and the opening/closing modules 90A are fixed by pressing to the base plate 150 via the heat-transfer grease 154. The base plate 150 has a cooling water channel 151 built-in, and an inlet 152 and an outlet 153 for cooling water are provided in this cooling water channel 151.

A control substrate 141 constructing the control circuit portion 140 is fixed to the base plate 150 via a fixed member (not shown), and this control substrate 141 is mounted with a microprocessor 143 to which a stabilized control voltage with a DC of 5 V for example, is supplied from a constant voltage power supply 142.

Further, the positive-side electrode terminal Pm and the negative-side electrode terminal Nm of the opening/closing module 90A are joined by welding to the positive-side divided terminal 135P and the negative-side divided terminal 134N in welding portions 97 and 98.

However, the negative-side electrode terminal Nm and the negative-side divided terminal 134N are integrally molded with the negative-side auxiliary conductive plate 10Nb, which is illustrated in FIG. 12A, interposed therebetween.

The AC electrode terminals AC of the three opening/closing modules 90A provided on the lower side of the composite circuit board 110C are connected to U1, V1, and W1 phases in first three-phase windings of the double three-phase AC motor as illustrated in FIG. 12. The AC electrode terminals AC of the three opening/closing modules 90A provided on the upper side of the composite circuit board 110C are connected to U2, V2, and W2 phases in second three-phase windings of the double three-phase AC motor as illustrated in FIG. 12. One phase shift is set between the orders of connection on the upper and lower sides.

Further, the upstream gate drive terminal 95 and the downstream gate drive terminal 96 described above with reference to FIG. 6A and FIG. 6B are directly connected by soldering to the control substrate 141.

(2) Main Points and Features of Third Embodiment

As apparent from the above description, the capacitor substrate unit according to the third embodiment of the present invention is the capacitor substrate unit 100C for opening/closing modules, which is connected between the DC power supply and the six opening/closing modules 90A each having the opening/closing element built-in, and includes the plurality of unit capacitors 101 connected in parallel to each other on the composite circuit board 110C to perform power supply smoothing. The opening/closing element is configured to convert DC power obtained from the DC power supply to AC power so as to drive a double three-phase AC motor.

The composite circuit board 110C has the DC power supply terminal block 120C including the positive-side power supply terminal 125P and the negative-side power supply terminal 124N that are connected to the positive terminal and the negative terminal of the DC power supply, and the six divided power supply terminal blocks 130C including the positive-side divided terminals 135P and the negative-side divided terminals 134N respectively connected to the positive-side electrode terminals Pm and the negative-side electrode terminals Nm of the six opening/closing modules 90A.

The composite circuit board 110C also has the negative-side first conductive plate 10N0 connected to the negative-side power supply terminal 124N, the positive-side second conductive plate 10P connected to the positive-side power supply terminal 125P having a polarity opposite to that of the negative-side power supply terminal 124N, and the front-side prepreg member 12PP configured to bond the negative-side first conductive plate 10N0 and the positive-side second conductive plate 10P while providing insulation.

The conductive plate through hole 10h0 and the surface layer through hole 12h, through which the connector of the positive-side lead terminal 101p of the unit capacitor 101 passes, are formed in the negative-side first conductive plate 10N0 and the front-side prepreg member 12PP.

The negative-side lead terminal 101n of each of the plurality of unit capacitors 101 being a surface mount device is soldered to the negative-side first conductive plate 10N0, and the positive-side lead terminal 101p of each of the plurality of unit capacitors 101 is soldered to the positive-side second conductive plate 10P.

The positive-side second conductive plate 10P is connected to the positive-side power supply terminal 125P and the positive-side divided terminal 135P, while the negative-side first conductive plate 10N0 is connected to the negative-side power supply terminal 124N and the negative-side divided terminal 134N.

Each of the plurality of unit capacitors 101 is formed of the conductive polymer solid aluminum electrolytic capacitor or the conductive polymer hybrid aluminum electrolytic capacitor. A plurality of capacitor rows each including the plurality of unit capacitors 101 arrayed along a shorter side of the composite circuit board 110C are arrayed along a longer side of the composite circuit board 110C.

A pair of three, a total of six, divided power supply terminal blocks 130C is arrayed along two longer sides of the composite circuit board 110C having a rectangular structure.

The total number of capacitor rows is two or more for one or a pair of the divided power supply terminal blocks 130C, and at least one common capacitor row is arranged between the divided power supply terminal blocks.

The divided power supply terminal blocks 130C are arranged on a pair of longer sides of the composite circuit board 110C even when the three-phase AC motor has any of one and two sets of the three-phase windings, and a pair of three, a total of six, divided power supply terminal blocks 130C is used.

The negative-side first conductive plate 10N0 is connected to the negative-side power supply terminal 124N via the negative-side divided terminal 134N and the negative-side auxiliary conductive plate 10Nb.

The plate thickness of the negative-side first conductive plate 10N0 is smaller than the plate thickness of the positive-side second conductive plate 10P.

Accordingly, relating to claim 5 of the present invention, the third embodiment has the same features as those of the second embodiment.

The auxiliary plate connector 124s is extended in the negative-side power supply terminal 124N, and the negative-side and positive-side module connectors 134a and 135a are extended in the negative-side and positive-side divided terminals 134N and 135P, respectively.

The negative-side module connector 134a is joined by welding to the negative-side electrode terminal Nm of the opening/closing module 90A with the negative-side auxiliary conductive plate 10Nb placed between the negative-side module connector 134a and the negative-side electrode terminal Nm.

The negative-side auxiliary conductive plate 10Nb is extended along the divided power supply terminal block 130C and the DC power supply terminal block 120C and joined by welding also to the auxiliary plate connector 124s of the negative-side power supply terminal 124N. The plate thickness of the negative-side auxiliary conductive plate 10Nb is a thickness dimension exceeding the plate thickness of the positive-side second conductive plate 10P.

As described above, relating to claim 8 of the present invention, the auxiliary plate connector extended to the negative-side power supply terminal and the module connector extended to the negative-side divided terminal are joined by welding to the negative-side auxiliary conductive plate, and the plate thickness of this negative-side auxiliary conductive plate is a thickness dimension exceeding the plate thickness of the positive-side second conductive plate.

Thus, the third embodiment has a feature in that the negative-side power supply terminal and the negative-side first conductive plate are connected to each other via the negative-side auxiliary conductive plate, and even when the plate thickness of the negative-side first conductive plate is reduced, the wiring resistance against the negative-side power supply terminals and the unit capacitors of three groups corresponding to the six divided power supply terminal blocks can be reduced, and the lamination structure of the composite circuit board is simplified as compared to a composite circuit board in which the auxiliary conductive plate is arranged on the back surface of the second conductive plate.

The third embodiment has a feature in that when three opening/closing modules are connected on each side of the composite circuit board, a potential difference between the two sides can be reduced even when the plate thickness of the negative-side first conductive plate is reduced. The third embodiment also has a feature in that the wiring resistance can be reduced similarly even when six divided power supply terminal blocks and three opening/closing modules are provided.

The ground conductive plate 10G is fixed by bonding to the back surface of the positive-side second conductive plate 10P via the back-side prepreg member 14PP.

The composite circuit board 110C is fixed by pressing to the base plate 150 by using the mounting screws 110s, and the ground conductive plate 10G is joined to the base plate 150 via the heat-transfer grease 154 so as to transfer heat.

As described above, relating to claim 9 of the present invention, the ground conductive plate is fixed by bonding to the back surface of the positive-side second conductive plate via the back-side prepreg member, and this ground conductive plate is fixed by pressing to the base plate via the heat-transfer grease.

Thus, the third embodiment has a feature in that the heat generated in the plurality of unit capacitors is transferred and dispersed to the base plate through the high heat-transfer members including the first conductive plate, the second conductive plate, and the ground conductive plate, the front-side and back-side prepreg members, and the heat-transfer grease. The heat-transfer effect of the entire surface can be enhanced due to a decrease in number of prepreg members used and a reduction in thickness dimension of the prepreg member.

Detailed Description of Fourth Embodiment (1) Detailed Description of Configuration In the following, a detailed description is given of a configuration illustrated in FIG. 16, which is a configuration view of an entire capacitor substrate unit according to a fourth embodiment of the present invention by focusing on a difference from the configuration illustrated in FIG. 1, with reference to the partial detailed views of FIG. 17A to FIG. 18C.

In each drawing, the same or corresponding parts are denoted by the same reference symbols. The capacitor substrate unit 100A is changed to a capacitor substrate unit 100D, and the capital letter at the end of the reference symbol indicates which embodiment the unit belongs to.

Main differences between the first embodiment and the fourth embodiment are that two layers of conductive plates including the positive-side first conductive plate 10P0 and the negative-side second conductive plate 10N is formed in place of the three layers of conductive plates including the positive-side first conductive plate 10P0, the negative-side second conductive plate 10N, and the positive-side auxiliary conductive plate 10Pa, that a positive-side auxiliary conductive plate 10Pb is provided externally, and that three opening/closing modules 90B connected to a set of three-phase windings is used in place of the three opening/closing modules 90A connected to a set of three-phase windings.

Figure 16:
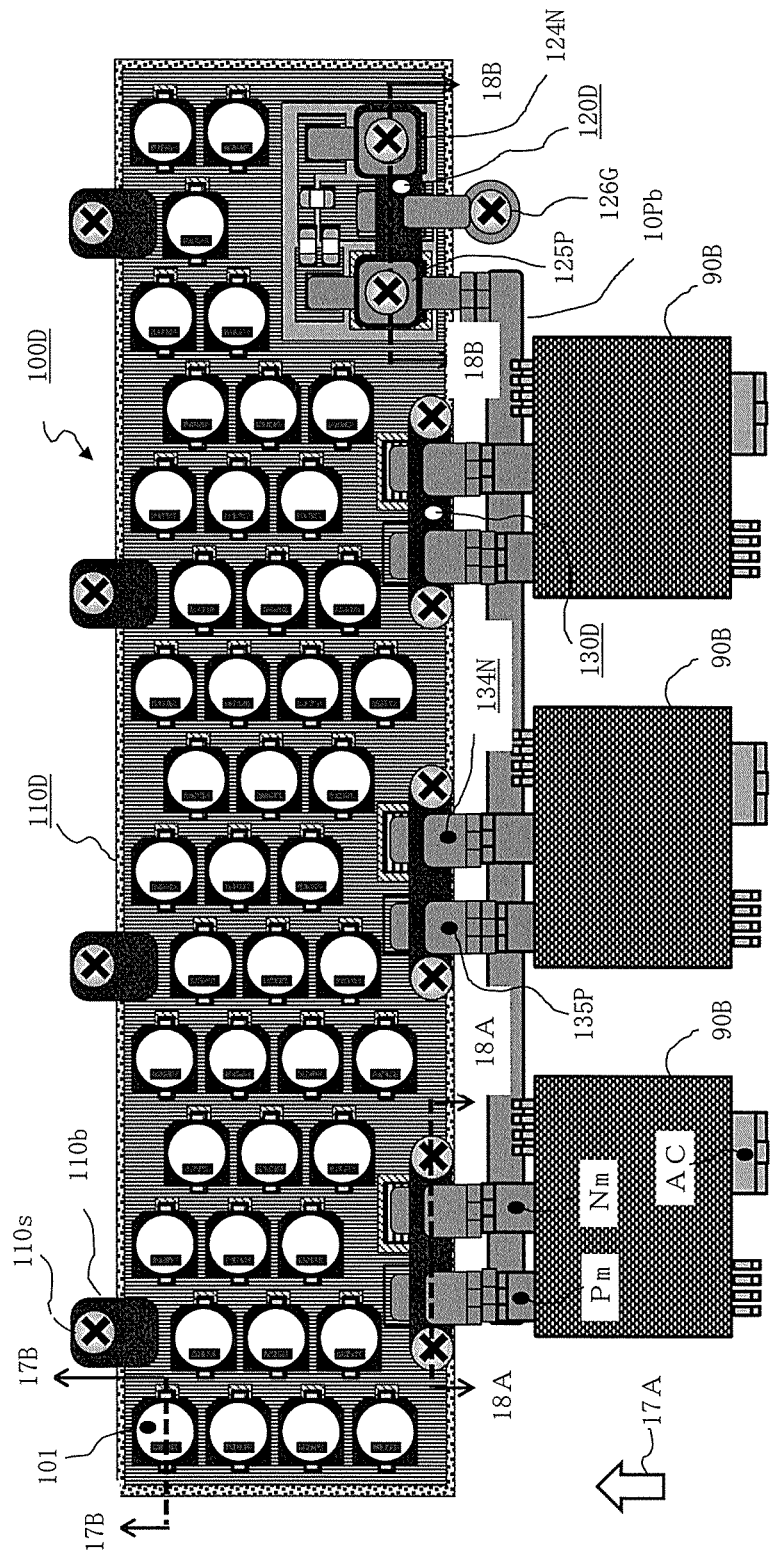
FIG. 16 is a configuration view of an entire capacitor substrate unit according to a fourth embodiment of the present invention.

In FIG. 16, a composite circuit board 110D, which is a main component of the capacitor substrate unit 100D, includes a plurality of laminate members described later with reference to FIG. 17A, and has a surface layer on which the plurality of unit capacitors 101 are connected in parallel to each other.

A DC power supply terminal block 120D and three divided power supply terminal blocks 130D are mounted onto one longer side (hereinafter sometimes referred to as a lower side) of the composite circuit board 110D having a rectangular shape.

The positive-side power supply terminal 125P provided on the DC power supply terminal block 120D and the positive-side divided terminal 135P provided in each of the three divided power supply terminal blocks 130D are connected to each other by the positive-side auxiliary conductive plate 10Pb, and the composite circuit board 110D is mounted onto the base plate 150 (see FIG. 15A) and is fixed thereto via the mounting screws 110s.

Although the mounting screw 110s illustrated in FIG. 16 is for pressing the upper side of the composite circuit board 110D to the base plate 150 via a resin-made pressing block 110b, the lower side of the composite circuit board 110D is fixed by pressing by using a pressing portion projecting from a pressing member (not shown). The pressing member collectively fixes by pressing the three opening/closing modules 90B to the base plate 150.

The positive-side power supply terminal 125P and the negative-side power supply terminal 124N are integrally molded on the DC power supply terminal block 120D made of a resin mold member, and the respective power supply terminals are connected to a positive electrode terminal and a negative electrode terminal of the DC power supply being, for example, a DC48V on-vehicle battery (not shown).

Similarly, the positive-side divided terminal 135P and the negative-side divided terminal 134N are integrally molded on each of the three divided power supply terminal blocks 130D made of a resin mold member, and the respective divided terminals are joined by welding to the positive-side electrode terminal Pm and the negative-side electrode terminal Nm of each of the three opening/closing modules 90B described above in FIG. 11A and FIG. 11B.

Further, the opening/closing modules 90B are connected to a set of three-phase windings in a three-phase AC motor (not shown) via the AC electrode terminals AC provided in the opening/closing modules 90B.

The array of the positive/negative terminals provided on the divided power supply terminal block 130D and the DC power supply terminal block 120D is different from the array of the positive/negative terminals provided on the divided power supply terminal block 130A and the DC power supply terminal block 120A, and hence the opening/closing module that has a terminal arrangement different from that of FIG. 1 is used.

Figure 17A:
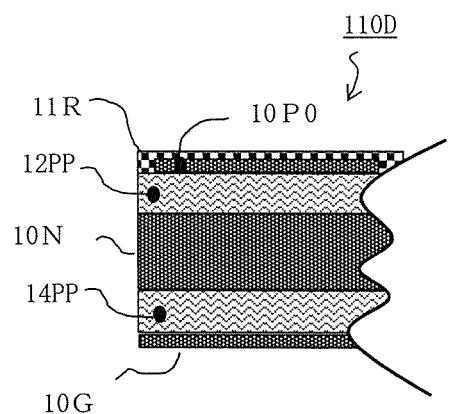
FIG. 17A is a side view of a composite circuit board viewed in a direction indicated by the arrow 17A of FIG. 16.
Figure 17B:
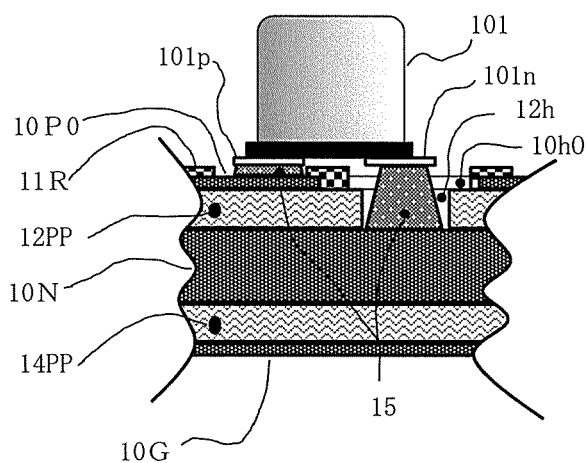
FIG. 17B is a cross-sectional view of the composite circuit board taken along the line 17B-17B of FIG. 16.

Next, a description is given of FIG. 17A being a side view of the composite circuit board viewed in a direction indicated by the arrow 17A of FIG. 16, and FIG. 17B being a cross-sectional view of the composite circuit board taken along the line 17B-17B of FIG. 16.

In FIG. 17A and FIG. 17B, the conductive plate has a two-layered structure of the positive-side first conductive plate 10P0 and the negative-side second conductive plate 10N. The positive-side lead terminal 101p of the unit capacitor 101 is connected by soldering to the positive-side first conductive plate 10P0, and the negative-side lead terminal 101n is connected by soldering to the negative-side second conductive plate 10N.

The positive-side auxiliary conductive plate 10Pa and the intermediate prepreg member 13PP illustrated in FIG. 3A are eliminated, and instead of those components, the positive-side auxiliary conductive plate 10Pb illustrated in FIG. 16 is provided.

Figure 18A:
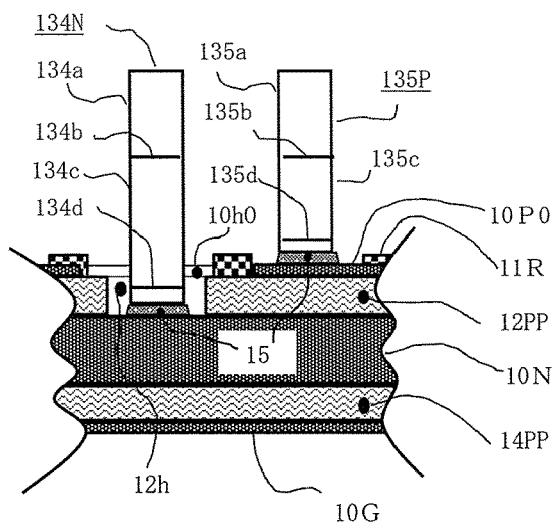
FIG. 18A is a cross-sectional view of the composite circuit board taken along the line 18A-18A of FIG. 16.
Figure 18B:
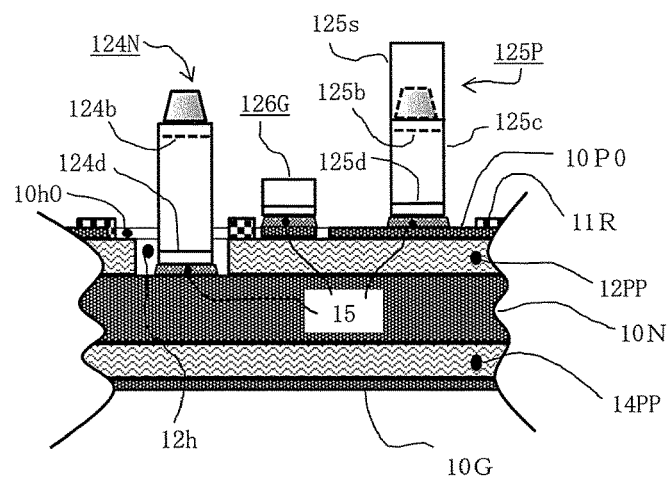
FIG. 18B is a cross-sectional view of the composite circuit board taken along the line 18B-18B of FIG. 16.
Figure 18C:
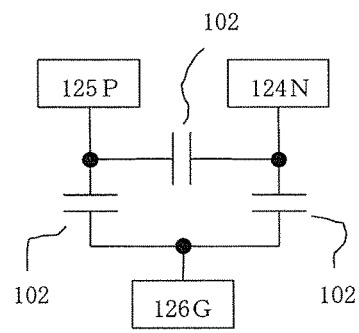
FIG. 18C is a circuit diagram of a ground capacitor illustrated in FIG. 16.

Next, a description is given of FIG. 18A being a cross-sectional view of the composite circuit board taken along the line 18A-18A of FIG. 16, FIG. 18B being a cross-sectional view of the composite circuit board taken along the line 18B-18B of FIG. 16, and FIG. 18C being a circuit diagram of a ground capacitor illustrated in FIG. 16.

In FIG. 18A, the positive-side divided terminal 135P includes the shelf plate portion 135b that is orthogonally bent from the module connector 135a, the orthogonal portion 135c that is orthogonally bent again to be parallel to the module connector 135a, and the positive-side connector 135d that is orthogonally bent from the orthogonal portion 135c. This positive-side connector 135d and the positive-side first conductive plate 10P0 are arranged in parallel and connected by soldering to each other by using the solder 15.

Further, the negative-side divided terminal 134N includes the shelf plate portion 134b that is orthogonally bent from the module connector 134a, the orthogonal portion 134c that is orthogonally bent again to be parallel to the module connector 134a, and the negative-side connector 134d that is orthogonally bent from the orthogonal portion 134c. This negative-side connector 134d and the negative-side second conductive plate 10N are arranged in parallel and connected by soldering to each other by using the solder 15.

The orthogonal portion 134c passes through the conductive plate through hole 10h0 formed in the positive-side first conductive plate 10P0 and the surface layer through hole 12h formed in the front-side prepreg member 12PP.

The negative-side second conductive plate 10N is connected to the negative-side power supply terminal 124N illustrated in FIG. 18B described later, and the positive-side first conductive plate 10P0 is connected to the positive-side power supply terminal 125P via the positive-side auxiliary conductive plate 10Pb (see FIG. 16).

In FIG. 18B, the positive-side power supply terminal 125P includes an auxiliary plate connector 125s, a shelf plate portion 125b, and the positive-side connector 125d, and the positive-side connector 125d is in abutment against the positive-side first conductive plate 10P0 and is soldered thereto by using the solder 15.

The negative-side power supply terminal 124N passes through the conductive plate through hole 10h0 formed in the positive-side first conductive plate 10P0 and the surface layer through hole 12h formed in the front-side prepreg member 12PP. The negative-side connector 124d arranged in parallel to the negative-side second conductive plate 10N is provided. The negative-side second conductive plate 10N and the negative-side connector 124d are connected by soldering by using the solder 15.

Accordingly, the positive-side power supply terminal 125P, the three positive-side divided terminals 135P, and the positive-side lead terminals 101p of the plurality of unit capacitors 101 are electrically connected in an integrated manner, and the negative-side power supply terminal 124N, the three negative-side divided terminals 134N, and the negative-side lead terminals 101n of the plurality of unit capacitors 101 are electrically connected in an integrated manner.

In FIG. 18C and FIG. 16, the noise absorption capacitors 102, for example, ceramic capacitors, are connected between the positive-side power supply terminal 125P and the earth terminal 126G, and between the negative-side power supply terminal 124N and the earth terminal 126G. The noise absorption capacitor 102 is the same as that of FIG. 14C.

(2) Main Points and Features of Fourth Embodiment

As apparent from the above description, the capacitor substrate unit according to the fourth embodiment of the present invention is the capacitor substrate unit 100D for opening/closing modules, which is connected between the DC power supply and the three opening/closing modules 90B each having the opening/closing element built-in, and includes the plurality of unit capacitors 101 connected in parallel to each other on the composite circuit board 110D to perform power supply smoothing. The opening/closing element is configured to convert DC power obtained from the DC power supply to AC power so as to drive a three-phase AC motor.

The composite circuit board 110D has the DC power supply terminal block 120D including the positive-side power supply terminal 125P and the negative-side power supply terminal 124N that are connected to the positive terminal and the negative terminal of the DC power supply, and the three divided power supply terminal blocks 130D including the positive-side divided terminals 135P and the negative-side divided terminals 134N respectively connected to the positive-side electrode terminals Pm and the negative-side electrode terminals Nm of the three opening/closing modules 90B.

The composite circuit board 110D also has the positive-side first conductive plate 10P0 connected to the positive-side power supply terminal 125P, the negative-side second conductive plate 10N connected to the negative-side power supply terminal 124N having a polarity opposite to that of the positive-side power supply terminal 125P, and the front-side prepreg member 12PP configured to bond the positive-side first conductive plate 10P0 and the negative-side second conductive plate 10N while providing insulation.

The conductive plate through hole 10h0 and the surface layer through hole 12h, through which the connector of the negative-side lead terminal 101n of the unit capacitor 101 passes, are formed in the positive-side first conductive plate 10P0 and the front-side prepreg member 12PP.

The positive-side lead terminal 101p of each of the plurality of unit capacitors 101 being a surface mount device is soldered to the positive-side first conductive plate 10P0, and the negative-side lead terminal 101n of each of the plurality of unit capacitors 101 is soldered to the negative-side second conductive plate 10N.

The negative-side second conductive plate 10N is connected to the negative-side power supply terminal 124N and the negative-side divided terminal 134N, while the positive-side first conductive plate 10P0 is connected to the positive-side power supply terminal 125P and the positive-side divided terminal 135P.

Each of the plurality of unit capacitors 101 is formed of the conductive polymer solid aluminum electrolytic capacitor or the conductive polymer hybrid aluminum electrolytic capacitor.

A plurality of capacitor rows each including the plurality of unit capacitors 101 arrayed along a shorter side of the composite circuit board 110D are arrayed along a longer side of the composite circuit board 110D.

The three divided power supply terminal blocks 130D are arrayed along one longer side of the composite circuit board 110D having a rectangular structure.

The total number of capacitor rows is two or more for one or a pair of the divided power supply terminal blocks 130, and at least one common capacitor row is arranged between the divided power supply terminal blocks.

The divided power supply terminal blocks 130D are arranged on a pair of longer sides of the composite circuit board 110D even when the three-phase AC motor has any of one and two sets of the three-phase windings, and a pair of three, a total of six, divided power supply terminal blocks 130D is used.

The positive-side first conductive plate 10P0 is connected to the positive-side power supply terminal 125P via the positive-side divided terminal 135P and the positive-side auxiliary conductive plate 10Pb.

The plate thickness of the positive-side first conductive plate 10P0 is smaller than the plate thickness of the negative-side second conductive plate 10N.

Accordingly, relating to claim 5 of the present invention, the fourth embodiment has the same features as those of the first embodiment.

The auxiliary plate connector 125s is extended in the positive-side power supply terminal 125P, and the negative-side and positive-side module connectors 134a and 135a are extended in the negative-side and positive-side divided terminals 134N and 135P, respectively.

The positive-side module connector 135a is joined by welding to the positive-side electrode terminal Pm of the opening/closing module 90B with the positive-side auxiliary conductive plate 10Pb placed between the positive-side module connector 135a and the positive-side electrode terminal Pm.

The positive-side auxiliary conductive plate 10Pb is extended along the divided power supply terminal block 130D and the DC power supply terminal block 120D and joined by welding also to the auxiliary plate connector 125s of the positive-side power supply terminal 125P.

The plate thickness of the positive-side auxiliary conductive plate 10Pb is a thickness dimension exceeding the plate thickness of the negative-side second conductive plate 10N.

As described above, relating to claim 8 of the present invention, the auxiliary plate connector extended to the positive-side power supply terminal and the module connector extended to the positive-side divided terminal are joined by welding to the positive-side auxiliary conductive plate, and the plate thickness of this positive-side auxiliary conductive plate is a thickness dimension exceeding the plate thickness of the positive-side second conductive plate.

Thus, the fourth embodiment has a feature in that the positive-side power supply terminal and the positive-side first conductive plate are connected to each other via the positive-side auxiliary conductive plate, and even when the plate thickness of the positive-side first conductive plate is reduced, the wiring resistance against the positive-side power supply terminals and the unit capacitors of three groups corresponding to the six divided power supply terminal blocks can be reduced, and the lamination structure of the composite circuit board is simplified as compared to a composite circuit board in which the auxiliary conductive plate is arranged on the back surface of the second conductive plate.

The fourth embodiment has a feature in that when three opening/closing modules are connected on each side of the composite circuit board, a potential difference between the two sides can be reduced even when the plate thickness of the negative-side first conductive plate is reduced. The fourth embodiment also has a feature in that the wiring resistance can be reduced similarly even when six divided power supply terminal blocks and three opening/closing modules are provided.

The ground conductive plate 10G is fixed by bonding to the back surface of the negative-side second conductive plate 10N via the back-side prepreg member 14PP.

The composite circuit board 110D is fixed by pressing to the base plate 150 by using the mounting screws 110s, and the ground conductive plate 10G is joined to the base plate 150 via the heat-transfer grease 154 so as to transfer heat.

As described above, relating to claim 9 of the present invention, the ground conductive plate is fixed by bonding to the back surface of the negative-side second conductive plate via the back-side prepreg member, and this ground conductive plate is fixed by pressing to the base plate via the heat-transfer grease.

Thus, the fourth embodiment has a feature in that the heat generated in the plurality of unit capacitors is transferred and dispersed to the base plate through the high heat-transfer members including the first conductive plate, the second conductive plate, and the ground conductive plate, the front-side and back-side prepreg members, and the heat-transfer grease. The heat-transfer effect of the entire surface can be enhanced due to a decrease in number of prepreg members used and a reduction in thickness dimension of the prepreg member.

What is claimed is:

1. A capacitor substrate unit for opening/closing modules, which is connected between a DC power supply and three or six opening/closing modules each having an opening/closing element built-in, and comprises a plurality of unit capacitors connected in parallel to each other on a composite circuit board to perform power supply smoothing, the opening/closing element being configured to convert a DC power obtained from the DC power supply to AC power so as to drive one of a three-phase AC motor and a double three-phase AC motor wherein:

the composite circuit board includes:

a DC power supply terminal block including a positive-side power supply terminal and a negative-side power supply terminal that are connected to a positive terminal and a negative terminal of the DC power supply;

three or six divided power supply terminal blocks each including a positive-side divided terminal and a negative-side divided terminal respectively connected to a positive-side electrode terminal and a negative-side electrode terminal of each of the three or six opening/closing modules;

one of a positive-side first conductive plate and a negative-side first conductive plate connected to corresponding one of the positive-side power supply terminal and the negative-side power supply terminal;

one of a negative-side second conductive plate and a positive-side second conductive plate connected to corresponding one of the negative-side power supply terminal and the positive-side power supply terminal having a polarity opposite to a polarity of the negative-side power supply terminal; and a front-side prepreg member configured to bond the one of the positive-side first conductive plate and the negative-side first conductive plate and corresponding one of the negative-side second conductive plate and the positive-side second conductive plate while providing insulation;

the one of the positive-side first conductive plate and the negative-side first conductive plate and the front-side prepreg member have formed therein a conductive plate through hole and a surface layer through hole, through which a connector of any one of a negative-side lead terminal and a positive-side lead terminal of each of the plurality of unit capacitors passes;

the one of the positive-side lead terminal and the negative-side lead terminal of each of the plurality of unit capacitors being a surface mount device is soldered to corresponding one of the positive-side first conductive plate and the negative-side first conductive plate, and the one of the negative-side lead terminal and the positive-side lead terminal of each of the plurality of unit capacitors is soldered to corresponding one of the negative-side second conductive plate and the positive-side second conductive plate;

the one of the negative-side second conductive plate and the positive-side second conductive plate is connected to corresponding one of the negative-side power supply terminal and the positive-side power supply terminal and corresponding one of the negative-side divided terminal and the positive-side divided terminal, while the one of the positive-side first conductive plate and the negative-side first conductive plate is connected to corresponding one of the positive-side power supply terminal and the negative-side power supply terminal and corresponding one of the positive-side divided terminal and the negative-side divided terminal;

each of the plurality of unit capacitors is formed of one of a conductive polymer solid aluminum electrolytic capacitor and a conductive polymer hybrid aluminum electrolytic capacitor, and is included in a plurality of capacitor rows, each of which includes a plurality of unit capacitors arrayed along a shorter side of the composite circuit board and which are arrayed along a longer side of the composite circuit board;

the three or six divided power supply terminal blocks include three divided power supply terminal blocks or a pair of three divided power supply terminal blocks, namely, six divided power supply terminal blocks arrayed along one or two longer sides of the composite circuit board having a rectangular structure; and a total number of the plurality of capacitor rows is two or more for one or a pair of the three or six divided power supply terminal blocks, and at least one common capacitor row is arranged between the three or six divided power supply terminal blocks.

2. The capacitor substrate unit for opening/closing modules according to claim 1, wherein:

the positive-side divided terminal and the negative-side divided terminal are integrated by each of the three or six divided power supply terminal blocks fixed to the composite circuit board; and the positive-side divided terminal and the negative-side divided terminal are arranged facing the positive-side electrode terminal and the negative-side electrode terminal provided in each of the three or six opening/closing modules on a joint surface for weld-joining with the positive-side divided terminal and the negative-side divided terminal, and the joint surface is a plane orthogonal to a board plane of the composite circuit board.

3. The capacitor substrate unit for opening/closing modules according to claim 2, wherein:

a total of six of the three or six divided power supply terminal blocks are arrayed along each of a pair of longer sides of a rectangle of the composite circuit board;

each of the three or six opening/closing modules constructs a half-bridge circuit in a square shape that includes:
   an upstream opening/closing element connected to the positive-side electrode terminal;
   a downstream opening/closing element connected to the negative-side electrode terminal;
   an upstream gate drive terminal with respect to the upstream opening/closing element;
   a downstream gate drive terminal with respect to the downstream opening/closing element; and
   an AC electrode terminal provided at a connecting point of the upstream opening/closing element and the downstream opening/closing element and connected to one of phase windings of the three-phase AC motor;

the positive-side electrode terminal and the negative-side electrode terminal are arranged in a biased manner on one side of opposite sides of the square;

the AC electrode terminal is arranged in a biased manner on another side of the opposite sides; and the upstream gate drive terminal and the downstream gate drive terminal are the positive-side electrode terminal and the negative-side electrode terminal, or are arranged side by side with the AC electrode terminal on the one side and the another side of the opposite sides of the square.

4. The capacitor substrate unit for opening/closing modules according to claim 3, wherein, in the three-phase AC motor that has a plurality of, a first set and a second set of, three-phase windings, and in which a pair of three-phase AC voltages with one of no phase difference and a predetermined phase difference $\alpha$ therebetween is applied to the plurality of sets of three-phase windings, three of the three or six opening/closing modules in the first set, which are arranged on one longer side of the composite circuit board to supply electricity to the three-phase windings in the first set, and three of the three or six opening/closing modules in the second set, which are arranged on another longer side of the composite circuit board to supply electricity to the three-phase windings in the second set, are connected in crisscross arrangement with one phase shift between the opening/closing module in the first set and the opening/closing module in the second set.

5. The capacitor substrate unit for opening/closing modules according to claim 4, wherein:

the three or six divided power supply terminal blocks are arranged on a pair of longer sides of the composite circuit board even when the three-phase AC motor has any of one set and two sets of the three-phase windings, and include the pair of three divided power supply terminal blocks, namely, the six divided power supply terminal blocks;

the one of the positive-side first conductive plate and the negative-side first conductive plate is connected to corresponding one of the positive-side power supply terminal and the negative-side power supply terminal via corresponding one of the positive-side divided terminal and the negative-side divided terminal and corresponding one of a positive-side auxiliary conductive plate and a negative-side auxiliary conductive plate; and the one of the positive-side first conductive plate and the negative-side first conductive plate has a plate thickness that is smaller than a plate thickness of corresponding one of the negative-side second conductive plate and the positive-side second conductive plate.

6. The capacitor substrate unit for opening/closing modules according to claim 2, wherein:

the three or six divided power supply terminal blocks are arranged on a pair of longer sides of the composite circuit board even when the three-phase AC motor has any of one set and two sets of the three-phase windings, and include the pair of three divided power supply terminal blocks, namely, the six divided power supply terminal blocks;

the one of the positive-side first conductive plate and the negative-side first conductive plate is connected to corresponding one of the positive-side power supply terminal and the negative-side power supply terminal via corresponding one of the positive-side divided terminal and the negative-side divided terminal and corresponding one of a positive-side auxiliary conductive plate and a negative-side auxiliary conductive plate; and the one of the positive-side first conductive plate and the negative-side first conductive plate has a plate thickness that is smaller than a plate thickness of corresponding one of the negative-side second conductive plate and the positive-side second conductive plate.

7. The capacitor substrate unit for opening/closing modules according to claim 3, wherein:

the three or six divided power supply terminal blocks are arranged on a pair of longer sides of the composite circuit board even when the three-phase AC motor has any of one set and two sets of the three-phase windings, and include the pair of three divided power supply terminal blocks, namely, the six divided power supply terminal blocks;

the one of the positive-side first conductive plate and the negative-side first conductive plate is connected to corresponding one of the positive-side power supply terminal and the negative-side power supply terminal via corresponding one of the positive-side divided terminal and the negative-side divided terminal and corresponding one of a positive-side auxiliary conductive plate and a negative-side auxiliary conductive plate; and the one of the positive-side first conductive plate and the negative-side first conductive plate has a plate thickness that is smaller than a plate thickness of corresponding one of the negative-side second conductive plate and the positive-side second conductive plate.

8. The capacitor substrate unit for opening/closing modules according to claim 1, wherein:

a total of six of the three or six divided power supply terminal blocks are arrayed along each of a pair of longer sides of a rectangle of the composite circuit board;

each of the three or six opening/closing modules constructs a half-bridge circuit in a square shape that includes:

an upstream opening/closing element connected to the positive-side electrode terminal;

a downstream opening/closing element connected to the negative-side electrode terminal;

an upstream gate drive terminal with respect to the upstream opening/closing element;

a downstream gate drive terminal with respect to the downstream opening/closing element; and an AC electrode terminal provided at a connecting point of the upstream opening/closing element and the downstream opening/closing element and connected to one of phase windings of the three-phase AC motor;

the positive-side electrode terminal and the negative-side electrode terminal are arranged in a biased manner on one side of opposite sides of the square;

the AC electrode terminal is arranged in a biased manner on another side of the opposite sides; and the upstream gate drive terminal and the downstream gate drive terminal are the positive-side electrode terminal and the negative-side electrode terminal, or are arranged side by side with the AC electrode terminal on the one side and the another side of the opposite sides of the square.

9. The capacitor substrate unit for opening/closing modules according to claim 8, wherein, in the three-phase AC motor that has a plurality of, a first set and a second set of, three-phase windings, and in which a pair of three-phase AC voltages with one of no phase difference and a predetermined phase difference $\alpha$ therebetween is applied to the plurality of sets of three-phase windings, three of the three or six opening/closing modules in the first set, which are arranged on one longer side of the composite circuit board to supply electricity to the three-phase windings in the first set, and three of the three or six opening/closing modules in the second set, which are arranged on another longer side of the composite circuit board to supply electricity to the three-phase windings in the second set, are connected in crisscross arrangement with one phase shift between the opening/closing module in the first set and the opening/closing module in the second set.

10. The capacitor substrate unit for opening/closing modules according to claim 9, wherein:

the three or six divided power supply terminal blocks are arranged on a pair of longer sides of the composite circuit board even when the three-phase AC motor has any of one set and two sets of the three-phase windings, and include the pair of three divided power supply terminal blocks, namely, the six divided power supply terminal blocks;

the one of the positive-side first conductive plate and the negative-side first conductive plate is connected to corresponding one of the positive-side power supply terminal and the negative-side power supply terminal via corresponding one of the positive-side divided terminal and the negative-side divided terminal and corresponding one of a positive-side auxiliary conductive plate and a negative-side auxiliary conductive plate; and the one of the positive-side first conductive plate and the negative-side first conductive plate has a plate thickness that is smaller than a plate thickness of corresponding one of the negative-side second conductive plate and the positive-side second conductive plate.

11. The capacitor substrate unit for opening/closing modules according to claim 8, wherein:

the three or six divided power supply terminal blocks are arranged on a pair of longer sides of the composite circuit board even when the three-phase AC motor has any of one set and two sets of the three-phase windings, and include the pair of three divided power supply terminal blocks, namely, the six divided power supply terminal blocks;

the one of the positive-side first conductive plate and the negative-side first conductive plate is connected to corresponding one of the positive-side power supply terminal and the negative-side power supply terminal via corresponding one of the positive-side divided terminal and the negative-side divided terminal and corresponding one of a positive-side auxiliary conductive plate and a negative-side auxiliary conductive plate; and the one of the positive-side first conductive plate and the negative-side first conductive plate has a plate thickness that is smaller than a plate thickness of corresponding one of the negative-side second conductive plate and the positive-side second conductive plate.

12. The capacitor substrate unit for opening/closing modules according to claim 1, wherein:

the three or six divided power supply terminal blocks are arranged on a pair of longer sides of the composite circuit board even when the three-phase AC motor has any of one set and two sets of the three-phase windings, and include the pair of three divided power supply terminal blocks, namely, the six divided power supply terminal blocks;

the one of the positive-side first conductive plate and the negative-side first conductive plate is connected to corresponding one of the positive-side power supply terminal and the negative-side power supply terminal via corresponding one of the positive-side divided terminal and the negative-side divided terminal and corresponding one of a positive-side auxiliary conductive plate and a negative-side auxiliary conductive plate; and the one of the positive-side first conductive plate and the negative-side first conductive plate has a plate thickness that is smaller than a plate thickness of corresponding one of the negative-side second conductive plate and the positive-side second conductive plate.

13. The capacitor substrate unit for opening/closing modules according to claim 12, wherein:

the one of the positive-side auxiliary conductive plate and the negative-side first conductive plate is fixed by bonding, via an intermediate prepreg member, to a surface of corresponding one of the negative-side second conductive plate and the positive-side second conductive plate that is opposite to a surface to which the one of the positive-side conductive plate and the negative-side first conductive plate is bonded via the front-side prepreg member;

the one of the positive-side auxiliary conductive plate and the negative-side auxiliary conductive plate has a plate thickness that is equal to or smaller than the plate thickness of corresponding one of the negative-side second conductive plate and the positive-side second conductive plate and larger than the plate thickness of corresponding one of the positive-side first conductive plate and the negative-side first conductive plate;

to the one of the positive-side auxiliary conductive plate and the negative-side auxiliary conductive plate, corresponding one of the positive-side power supply terminal and the negative-side power supply terminal provided on the DC power supply terminal block is connected by soldering and corresponding one of the positive-side divided terminal and the negative-side divided terminal provided on each of the three or six divided power supply terminal blocks is connected by soldering;

the one of the positive-side power supply terminal and the negative-side power supply terminal and the one of the positive-side divided terminal and the negative-side divided terminal are in abutment against and connected by soldering to corresponding one of the positive-side auxiliary conductive plate and the negative-side auxiliary conductive plate by passing through the conductive plate through hole formed in corresponding one of the positive-side first conductive plate and the negative-side first conductive plate, the surface layer through hole formed in the front-side prepreg member, corresponding one of a negative-side through hole and a positive-side through hole formed in corresponding one of the negative-side second conductive plate and the positive-side second conductive plate, and an intermediate through hole formed in the intermediate prepreg member; and the one of the positive-side divided terminal and the negative-side divided terminal is connected by soldering to corresponding one of the positive-side first conductive plate and the negative-side first conductive plate via a branched coupling portion.

14. The capacitor substrate unit for opening/closing modules according to claim 13, further comprising a ground conductive plate fixed by bonding to a back surface of the one of the positive-side auxiliary conductive plate and the negative-side auxiliary conductive plate via a back-side prepreg member, wherein the composite circuit board is fixed by pressing to a base plate by using a mounting screw, and the ground conductive plate is joined to the base plate so as to transfer heat via heat-transfer grease.

15. The capacitor substrate unit for opening/closing modules according to claim 12, further comprising:

an auxiliary plate connector extended in any one of the negative-side power supply terminal and the positive-side power supply terminal; and a negative-side module connector and a positive-side module connector extended in the negative-side divided terminal and the positive-side divided terminal, respectively, wherein:

one of the negative-side module connector and the positive-side module connector is joined by welding to corresponding one of the negative-side electrode terminal and the positive-side electrode terminal of each of the three or six opening/closing modules with corresponding one of the negative-side auxiliary conductive plate and the positive-side auxiliary conductive plate placed between the one of the negative-side module connector and the positive-side module connector and the one of the negative-side electrode terminal and the positive-side electrode terminal;

the one of the negative-side auxiliary conductive plate and the positive-side auxiliary conductive plate is extended along the three or six divided power supply terminal blocks and the DC power supply terminal block and is joined by welding also to the auxiliary plate connector of corresponding one of the negative-side power supply terminal and the positive-side power supply terminal; and the one of the negative-side auxiliary conductive plate and the positive-side auxiliary conductive plate has a plate thickness that is a thickness dimension exceeding the plate thickness of corresponding one of the positive-side second conductive plate and the negative-side second conductive plate.

16. The capacitor substrate unit for opening/closing modules according to claim 15, further comprising a ground conductive plate fixed by bonding to a back surface of the one of the positive-side second conductive plate and the negative-side second conductive plate via a back-side prepreg member, wherein the composite circuit board is fixed by pressing to a base plate by using a mounting screw, and the ground conductive plate is joined to the base plate so as to transfer heat via heat-transfer grease.

* * * * *